(12) United States Patent
Oshita et al.

(10) Patent No.: US 11,532,449 B2
(45) Date of Patent: Dec. 20, 2022

(54) PULSE CONTROL DEVICE

(71) Applicant: Rohm Co., Ltd., Kyoto (JP)

(72) Inventors: Hiroto Oshita, Kyoto (JP); Tetsuo Tateishi, Kyoto (JP); Yosuke Fukumoto, Kyoto (JP); Yuhei Yamaguchi, Kyoto (JP); Yoju Imamura, Kyoto (JP); Genki Tsuruyama, Tokyo (JP)

(73) Assignee: Rohm Co., Ltd., Kyoto (JP)

( * ) Notice: Subject to any disclaimer, the term of this patent is extended or adjusted under 35 U.S.C. 154(b) by 672 days.

(21) Appl. No.: 16/469,790

(22) PCT Filed: Jan. 29, 2018

(86) PCT No.: PCT/JP2018/002686
§ 371 (c)(1),
(2) Date: Jun. 14, 2019

(87) PCT Pub. No.: WO2018/139636
PCT Pub. Date: Aug. 2, 2018

(65) Prior Publication Data
US 2020/0083009 A1     Mar. 12, 2020

(30) Foreign Application Priority Data

Jan. 30, 2017 (JP) .............................. JP2017-014439
Jan. 25, 2018 (JP) .............................. JP2018-010329

(51) Int. Cl.
*H01H 47/32* (2006.01)
*H02M 1/08* (2006.01)
*H03K 7/08* (2006.01)

(52) U.S. Cl.
CPC .............. *H01H 47/32* (2013.01); *H02M 1/08* (2013.01); *H03K 7/08* (2013.01)

(58) Field of Classification Search
CPC ...... H01H 47/325; H01H 47/32; H01H 9/161; H03K 7/08; H02M 1/08; H02M 3/158; H02M 1/0025; H02M 1/0064
(Continued)

(56) References Cited

U.S. PATENT DOCUMENTS 4,520,420 A * 5/1985 Ariyoshi .............. H01H 47/325
                                                         123/490
6,154,086 A * 11/2000 Manolescu .......... H03K 17/302
                                                         307/130
(Continued)

FOREIGN PATENT DOCUMENTS

JP      H02216725      8/1990
JP      H8-125495 A    5/1996
(Continued)

OTHER PUBLICATIONS

Japan Patent Office, Office Action for corresponding Japanese Application No. 2018-144733 dated Oct. 8, 2019 with English Translation.
(Continued)

*Primary Examiner* — Yemane Mehari
(74) *Attorney, Agent, or Firm* — Fish & Richardson P.C.

(57) ABSTRACT

A pulse control device 10 comprises: a switch output unit 100 which generates a pulse output voltage Vo from a direct-current input voltage Vi and supplies the pulse output voltage Vo to a load (such as a relay coil 21 of a mechanical relay 20); a low-pass filter unit 300 which receives a feedback input of the pulse output voltage Vo and generates a feedback voltage Vfb; and an output feedback control unit 200 which receives an input of the feedback voltage Vfb and controls the switch output unit 100 so that an average value of the pulse output voltage Vo becomes constant. The low-pass filter unit 300 may be configured without a coil.

9 Claims, 22 Drawing Sheets

(58) Field of Classification Search
USPC .............................................................. 327/1
See application file for complete search history.

(56) References Cited

U.S. PATENT DOCUMENTS

| | | | | |
|---|---|---|---|---|
| 6,674,628 B1* | 1/2004 | Wohlfarth | ............ | H01H 47/325 |
| | | | | 361/152 |
| 2005/0104597 A1* | 5/2005 | Klijn | .................. | G01R 31/3278 |
| | | | | 324/418 |
| 2014/0152284 A1* | 6/2014 | Rozek | .................... | H02M 3/156 |
| | | | | 323/284 |

FOREIGN PATENT DOCUMENTS

| | | |
|---|---|---|
| JP | H8-275509 A | 10/1996 |
| JP | 2001-157490 | 6/2001 |
| JP | 2001186657 A | 7/2001 |
| JP | 2003-032919 A | 1/2003 |
| JP | 2006-114446 A | 4/2006 |
| JP | 2010-110190 | 5/2010 |
| JP | 2011-216229 A | 10/2011 |
| JP | 2012190701 A | 10/2012 |
| JP | 2013-017092 A | 1/2013 |
| JP | 2015-153556 A | 8/2015 |

OTHER PUBLICATIONS

Japan Patent Office, International Search Report for PCT/JP/002686 dated Feb. 27, 2018 (with English translation).
Office Action for corresponding JP application No. 2018-512223 dated May 29, 2018 (with English Translation).

* cited by examiner

PULSE CONTROL DEVICE

TECHNICAL FIELD

The invention disclosed herein relates to a pulse control device.

BACKGROUND ART

Conventionally, mechanical relays (electrically operated mechanical switches) are widely used as isolating switches in a variety of electric appliances (household appliances, industrial appliances, transportation appliances, agricultural appliances, and the like).

FIG. 22 is a diagram showing, as a conventional example, an electric appliance provided with a mechanical relay. In the electric appliance X of this conventional example, turning a coil current on and off using a switch X10 results in driving a mechanical relay X20 to open and close. Inconveniently, however, with the configuration of this conventional example, a direct-current input voltage Vi is applied directly to the relay coil X21, and this requires that the diameter and the number of turns of the relay coil X21 be changed in accordance with the voltage value (for example, DC 6V, DC 12 V, DC 24 V, or DC 48 V) of the direct-current input voltage Vi. This poses problems in terms of cost and management.

Examples of conventional technology related to what has just been discussed are seen in Patent Documents 1 to 4 identified below.

The control flow disclosed in Patent Document 1 can be summarized as follows: (1) a pulse voltage is generated and is fed to a switching device; (2) for each period, the pulse width and the period of the pulse voltage are set beforehand so that, of the coil current, the maximum value exceeds the operating current value and in addition the minimum value does not drop below the recovery current value; and (3) a regeneration diode is provided so that, even during the off-period of the pulse voltage, the coil current decreases gradually.

According to this technology, which uses open control, the pulse width and the period of the pulse voltage are constant. Accordingly, variations in the characteristics of the switching control circuit and the switching device tend to cause variations in the pulse voltage.

The control flow disclosed in Patent Document 2 can be summarized as follows: (1) an input voltage is increased while being monitored; (2) when the input voltage has risen to reach a low-side reference voltage, a switching device is turned on to start analog control; (3) when the input voltage has risen further to reach a high-side reference voltage, PWM (pulse-width modulation) control takes over to reduce power consumption; and (4) regardless of analog or PWM control, if the input voltage is higher than an overexcitation voltage value, the output is reduced until the input voltage becomes close to the recovery voltage value.

According to this technology, a driving circuit is provided with two output terminals, of which one is selected alternatively in accordance with the result of the monitoring of the input voltage (direct-current voltage) to switch between analog and PWM control. Also here, a regeneration diode is provided.

The control flow disclosed in Patent Document 3 can be summarized as follows: (1) a switching device is turned on by a relay control circuit to pass a coil current; (2) when the coil current reaches an overexcitation voltage value and the relay closes and turns on, PWM control is started so that the coil current does not drop below the holding current value; here, during the off-period of the switching device, the regeneration diode makes the coil current decrease gently; and (3) when the coil current drops below the holding current value, the relay opens and turns off.

According to this technology, through PWM control of a driving signal (through pulse application), the coil current during the on-state of the relay is reduced. Inconveniently, however, too high a switching frequency leads to heat generation to be dealt with; conversely, too low a switching frequency may fall within the human audible frequency range, causing audible noise.

The control flow disclosed in Patent Document 4 can be summarized as follows: (1) a direct-current output voltage of a variable voltage regulator is set at the overexcitation voltage value; (2) a switching device is turned on by a relay control circuit to pass an overexcitation current through the relay coil and thereby turn the relay on; (3) the direct-current output voltage of the variable voltage regulator is lowered down to the holding voltage value; (4) the switching device is turned off to cut off the coil current and thereby turn the relay off.

According to this technology, the coil current is controlled by the variable voltage regulator provided in the stage preceding the relay coil, and thereby heat generation resulting from high-frequency driving is reduced. Here, no regeneration diode is needed. Inconveniently, however, the variable voltage regulator, which receives a feedback input of the direct-current output voltage to perform output feedback control, needs to be provided with a smoothing filter. Thus, an accordingly larger number of components are required.

LIST OF CITATIONS

Patent Literature

Patent Document 1: Japanese Patent Application published as No. 2006-114446
Patent Document 2: Japanese Patent Application published as No. 2015-153556
Patent Document 3: Japanese Patent Application published as No. 2003-32919
Patent Document 4: Japanese Patent Application published as No. 2011-216229

SUMMARY OF THE INVENTION

Technical Problem

As discussed above, a configuration where the direct-current input voltage is applied directly to the relay coil poses the problem of difficulty standardizing relay coils, and a configuration where a DC-DC converter is added in the stage preceding the relay coil poses the problem of necessitating a smoothing filter. Also a configuration where the voltage applied to the relay coil undergoes PWM control poses various problems including output variations during open control, heat generation during high-frequency driving, and audible noise during low-frequency driving.

The various problems mentioned above are encountered not only when a relay coil is driven but also during the driving of other inductive loads (such as motor coils and solenoids) or loads (such as light-emitting diodes and organic EL (electroluminescence) devices) whose operation is not affected so long as the switching frequency of the voltage applied to them is sufficiently high.

In view of the above-mentioned problems encountered by the present inventors, an object of the present invention is to provide a pulse control device that is suitable to Means for Solving the Problem According to one aspect of what is disclosed herein, a pulse control device includes: a switching output stage configured to generate a pulse output voltage from a direct-current input voltage and feed the pulse output voltage to a load; a low-pass filter configured to receive a feedback input of the pulse output voltage and generate a feedback voltage; and an output feedback controller configured to receive the feedback voltage and control the switching output stage such that the average value of the pulse output voltage remains constant.

According to another aspect of what is disclosed herein, a pulse control device includes: a switching output stage configured to feed a pulse output voltage to the relay coil of a mechanical relay; and a light-emitting element driver configured to feed an output current to a light-emitting element in the mechanical relay.

According to another aspect of what is disclosed herein, a pulse control device includes a switching output stage configured to feed a pulse output voltage to a relay coil. The switching output stage includes a synchronous rectification transistor, or a rectification diode, that is connected in parallel with the relay coil, and the body diode that accompanies the synchronous rectification transistor, or the rectification diode, is used as a regeneration diode.

According to another aspect of what is disclosed herein, a mechanical relay includes: a relay coil; a first frame to which a direct-current input voltage is applied; a second frame to which the first terminal of the relay coil is connected; a third frame to which the second terminal of the relay coil is connected; and a pulse control device mounted directly on the first, second, and third frames and configured to feed a pulse output voltage to the relay coil.

Other features, elements, steps, benefits, and characteristics of the present invention will become clearer with reference to the following detailed description of preferred embodiments of the invention in conjunction with the accompanying drawings.

Advantageous Effects of the Invention

According to the invention disclosed herein, it is possible to provide a pulse control device that is suitable to drive a load.

DESCRIPTION OF EMBODIMENTS

<Comparative Example>

Prior to a description of novel configurations of an electric appliance provided with a mechanical relay, a comparative example, with which they will be compared, will be described briefly.

Figure 1:
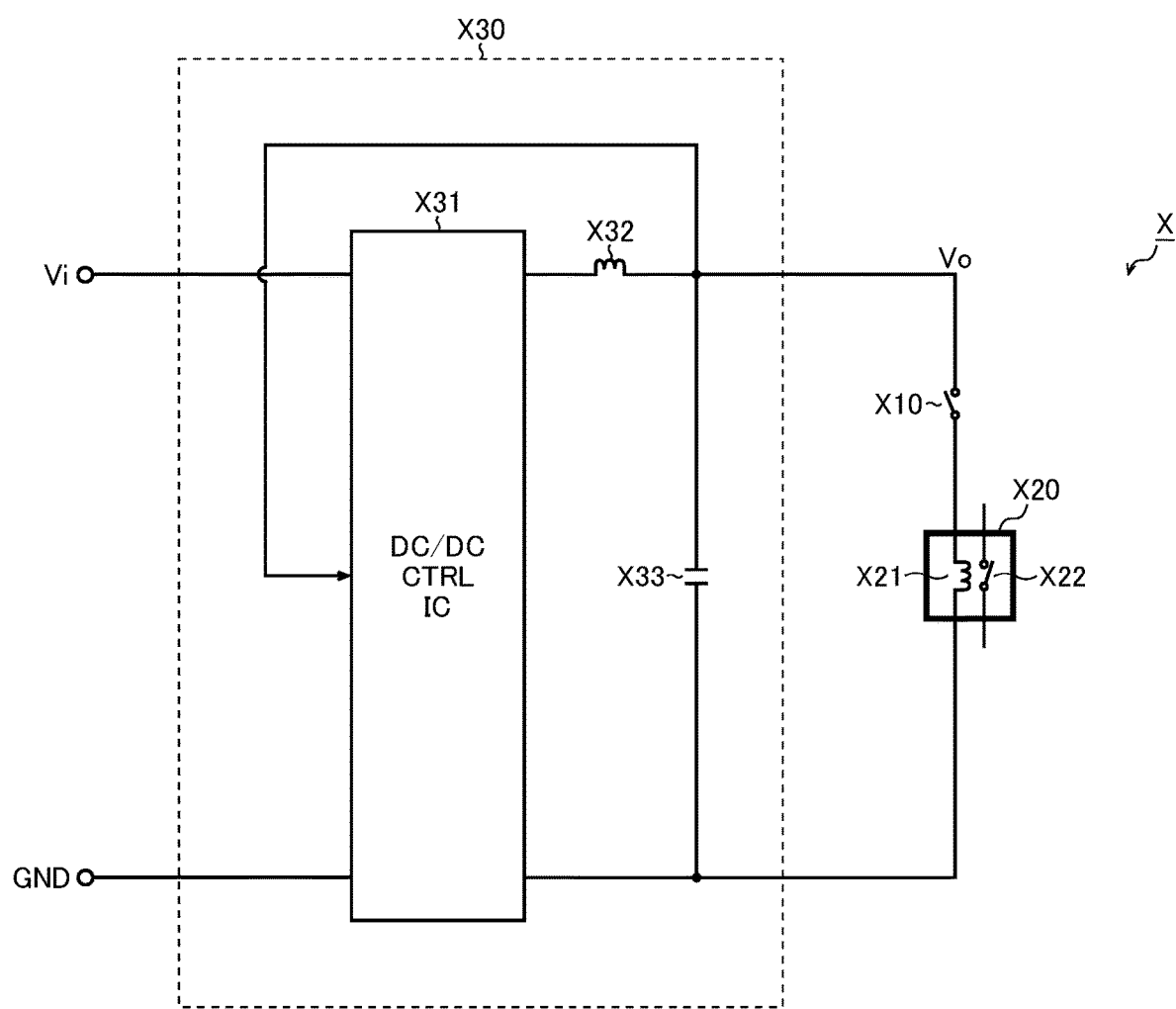
FIG. 1 is a diagram showing, as a comparative example, an electric appliance provided with a mechanical relay.
Figure 22:
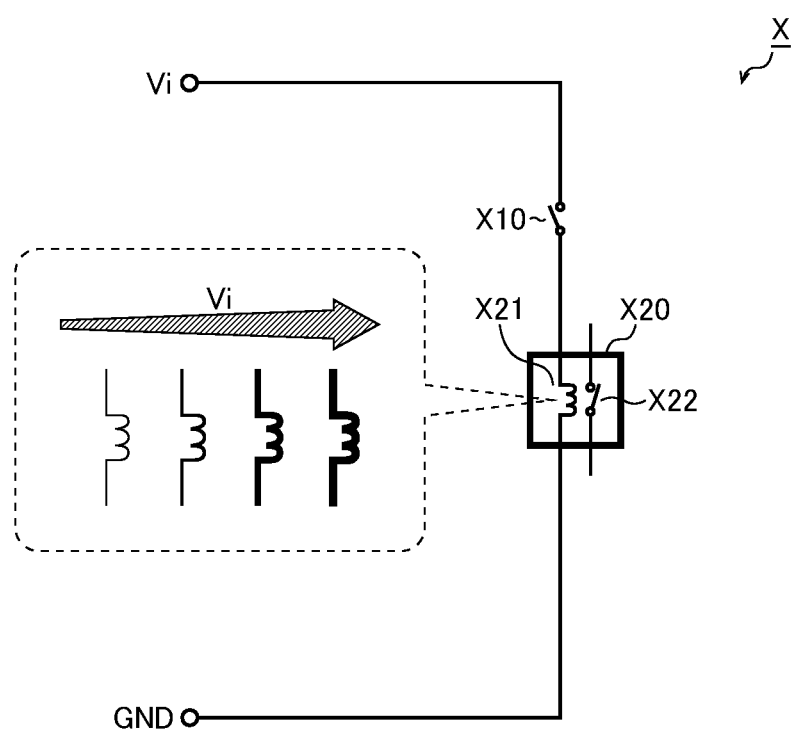
FIG. 22 is a diagram showing, as a conventional example, an electric appliance provided with a mechanical relay.

FIG. 1 shows, as the comparative example, an electric appliance provided with a mechanical relay. The electric appliance X of this comparative example, while being based on the conventional example (FIG. 22) described previously, further includes a DC-DC converter X30 that generates from a direct-current input voltage Vi a desired direct-current output voltage Vo (for example, DC 5 V) to feed it to the relay coil X21.

With the configuration of this comparative example, regardless of the voltage value of the direct-current input voltage Vi, a direct-current output voltage Vo that remains constant all the time is applied to the relay coil X21. This allows standardizing of the diameter and the number of turns of the relay coil X21. Even so, however, the configuration of this comparative example requires that, as a means for smoothing the direct-current output voltage Vo, a coil X32 and a capacitor X33 be externally connected to a controller IC X31 in the DC-DC converter X30. This results in an increased number of components.

<First Embodiment>

Figure 2:
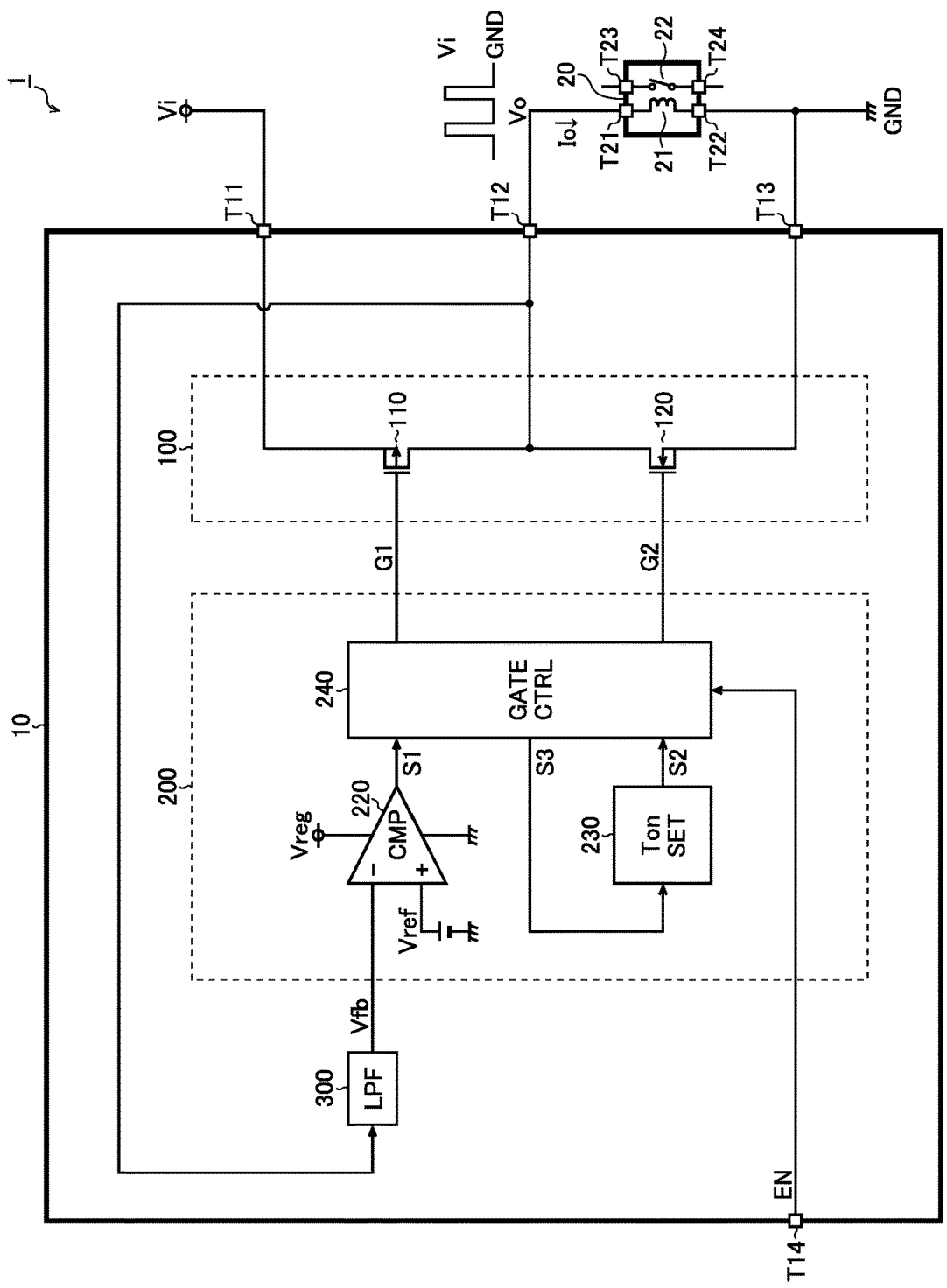
FIG. 2 is a diagram showing, as a first embodiment, an electric appliance provided with a mechanical relay.

FIG. 2 is a diagram showing, as a first embodiment, an electric appliance provided with a mechanical relay. The electric appliance 1 of this embodiment includes a pulse control device 10 and a mechanical relay 20.

The pulse control device 10 is a semiconductor integrated circuit device that generates from a direct-current input voltage Vi (for example, DC 6V, DC 12 V, DC 24 V, or DC 48 V) a pulse output voltage Vo to feed it to a load. In the electric appliance 1 of this embodiment, to the pulse control device 10 is connected, as the load, an electromagnetic section 21 (in particular, a relay coil included in it) of the mechanical relay 20. Thus, the pulse control device 10 functions as a relay driving device that drives the mechanical relay 20 to make it open and close.

The mechanical relay 20 includes, in addition to the electromagnetic section 21, a contact mechanism section 22 that is electrically isolated from the electromagnetic section 21. According to whether the electromagnetic section 21 is excited or is not excited, the mechanical relay 20 drives the contact mechanism section 22 to make it open or close. Using a mechanical relay 20 as a switching means in an electric appliance 1 in this way makes it possible to operate a switch while achieving isolation between the input side (the electromagnetic section 21 side) and the output side (the contact mechanism section 22 side). The mechanical relay 20 may be of any of different types for different uses, examples including control relays, latching relays (keep relays), ratchet relays, I/O relays, terminal relays or relay terminals, or high-capacity relays (for alternating-current and direct-current loads).

<Mechanical Relay>

Figure 3:
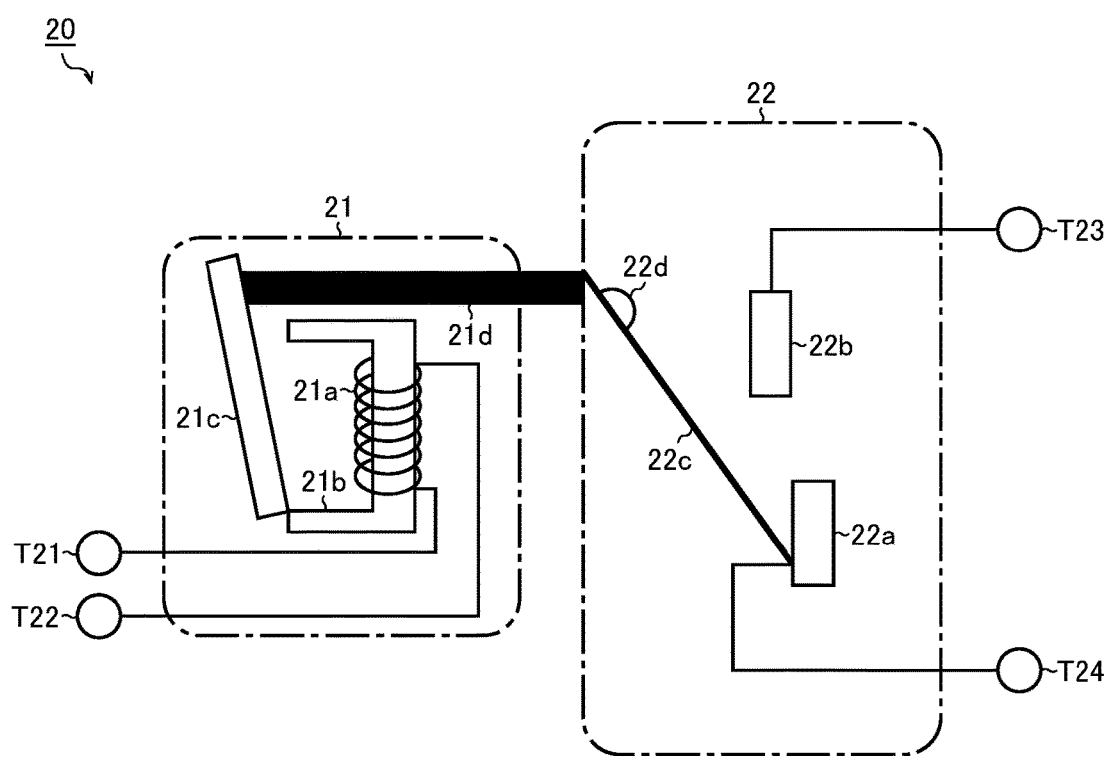
FIG. 3 is a diagram showing one configuration example of a mechanical relay.

FIG. 3 is a diagram showing one configuration example of the mechanical relay 20. In the mechanical relay 20 of this configuration example, the electromagnetic section 21 includes a relay coil 21a, an iron core 21b, an armature 21c, and a card 21d. On the other hand, the contact mechanism section 22 includes fixed contacts 22a and 22b, a moving spring 22c, and a moving contact 22d. For the purpose of establishing electrical connection with the outside, the mechanical relay 20 further includes external terminals T21 the T24.

The relay coil 21a is wound around the iron core 21b (or around a coil bobbin (unillustrated) about the iron core 21b), and the opposite ends of the relay coil 21a are connected to the external terminals T21 and T22 respectively. When the pulse control device 10 energizes the relay coil 21a, the relay coil 21a produces a magnetic field and magnetizes the iron core 21b. As a result, the armature 21c, rotating about a hinge, is attracted to the iron core 21b.

At that time, the card 21d, which is coupled to the armature 21c, pushes forward the moving spring 22c, with which the card 21d is in contact, so as to bias the moving spring 22c toward the fixed contact 22b. As a result, the moving contact 22d, which is provided at the free end of the moving spring 22c, makes contact with the fixed contact 22b. This brings a state where the external terminals T23 and T24 electrically conduct to each other via the fixed contact 22b, the moving contact 22d, the moving spring 22c, and the fixed contact 22a (that is, the on-state of the mechanical relay 20).

By contrast, when the pulse control device 10 ceases to energize the relay coil 21a, the relay coil 21a ceases to produce the magnetic field. Thus, the iron core 21b loses its magnetic force with which it has been attracting the armature 21c. As a result, the restoring force of the moving spring 22c causes the armature 21c and the card 21d to return to their original positions, so that the moving contact 22d moves off the fixed contact 22b. This brings back the state where the external terminals T23 and T24 are electrically isolated from each other (that is, the off-state of the mechanical relay 20).

While FIG. 3 shows, as an example, a mechanical relay 20 of a hinge type, the mechanical relay 20 may have a structure of any other type (for example, a plunger type).

<Pulse Control Device>

With reference back to FIG. 2, the configuration and the operation of the pulse control device 10 will be described. The pulse control device 10 in this embodiment has integrated into it a switching output stage 100, an output feedback controller 200, and a low-pass filter 300. For the purpose of establishing electrical connection with the outside, the pulse control device 10 further includes external terminals T11 to T14.

Outside the pulse control device 10, the external terminal T11 is connected to the application terminal of the direct-current input voltage Vi. The external terminal T12 is connected to the external terminal T21 of the mechanical relay 20 (that is, to the first terminal of the relay coil 21a included in the electromagnetic section 21). The external terminal T13 is connected to the external terminal T22 of the mechanical relay 20 (that is, to the second terminal of the relay coil 21a included in the electromagnetic section 21). The external terminal T13 is connected also to a grounded terminal (that is, the application terminal of a ground voltage GND). The external terminal T14 is connected to the application terminal of an enable signal EN (corresponding to an on/off control signal for the mechanical relay 20).

The switching output stage 100 includes a high-side switch 110 (for example, a PMOSFET (p-channel type metal-oxide-semiconductor field-effect transistor) and a low-side switch 120 (for example, an NMOSFET (n-channel type metal-oxide-semiconductor field-effect transistor). The switching output stage 100 generates from the direct-current input voltage Vi a pulse output voltage Vo and feeds it to the electromagnetic section 21 (in particular, the relay coil 21a included in it) of the mechanical relay 20.

The interconnection in the switching output stage 100 is as follows. The source and the back gate of the high-side switch 110 are both connected to the external terminal T11. The drain of the high-side switch 110 and the drain of the low-side switch 120 are both connected to the external terminal T12. The source and the back gate of the low-side switch 120 are both connected to the external terminal T13.

The gate of the high-side switch 110 is fed with a high-side gate signal G1. The high-side switch 110 is off when the high-side gate signal G1 is at high level (=Vi), and is on when the high-side gate signal G1 is at low level (=VregB=Vi−Vreg, where Vreg represents a predetermined internal supply voltage).

The gate of the low-side switch 120 is fed with a low-side gate signal G2. The low-side switch 120 is on when the low-side gate signal G2 is at high level (=Vreg), and is off when the low-side gate signal G2 is at low level (=GND).

When the high-side switch 110 is on and the low-side switch 120 is off, the pulse output voltage Vo is at high level (=Vi). By contrast, when the high-side switch 110 is off and the low-side switch 120 is on, the pulse output voltage Vo is at low level (=GND). Thus, the pulse output voltage Vo is a voltage with a square waveform that is pulse-driven between the direct-current input voltage Vi and the ground voltage GND.

The low-pass filter 300 receives, within the pulse control device 10, a feedback input of the pulse output voltage Vo from the switching output stage 100, and generates a feedback voltage Vfb by blunting the pulse output voltage Vo. The input terminal of the low-pass filter 300 is connected to the connection node between the high-side and lower-side switches 110 and 120 (that is, the external terminal T12).

The output feedback controller 200 receives the feedback voltage Vfb from the low-pass filter (feedback voltage generator) 300. The output feedback controller 200 controls the switching output stage 100 by generating the high-side and low-side gate signals G1 and G2 individually such that the average value of the pulse output voltage Vo remains at a target average value Voave (for example, DC 5 V). The output feedback controller 200 includes a comparator 220, an on-time setter 230, and a gate controller 240.

The comparator 220 generates a set signal S1 by comparing the feedback voltage Vfb, which is fed to the inverting input terminal (−) of the comparator 220, with a reference voltage Vref (for example, a voltage, such as a bandgap reference voltage, that does not depend on variation of the supplied power or of temperature), which is fed to the non-inverting input terminal (+) of the comparator 220. The set signal S1 is at high level (=Vreg) when the feedback voltage Vfb is lower than the reference voltage Vref, and is at low level (=GND) when the feedback voltage Vfb is higher than the reference voltage Vref.

The on-time setter 230 receives a gate control signal S3 (which will be described in detail later) from the gate controller 240. When the high-side switch 110 is turned on and then a predetermined on-time Ton passes, the on-time setter 230 generates a trigger pulse in a reset signal S2.

The gate controller 240 generates the high-side and low-side gate signals G1 and G2 in accordance with the set signal S1 and the reset signal S2.

In this embodiment, the output feedback controller 200 controls the switching output stage 100 by a hysteresis control method (in the illustrated example, by a bottom detection fixed on-time method) based on the feedback voltage Vfb. This output feedback control operation will be described in detail later.

In terms of whether or not to generate the pulse output voltage Vo, the output feedback controller 200 is controlled in accordance with an enable signal EN, which is fed to the external terminal T14. More specifically, when the enable signal EN is at high level (a logic level indicating the coil being energized), the output feedback controller 200 is in an active state (a state where it is enabled to generate the pulse output voltage Vo), and when the enable signal EN is at low level (a logic level indicating the coil not being energized), the output feedback controller 200 is in a shut-down state (a state where it is disabled from generating the pulse output voltage Vo). When the enable signal EN is turned from low level to high level, the gate controller 240 starts up in a state where it keeps the high-side switch 110 on and the low-side switch 120 off.

As described above, with the pulse control device 10 of this embodiment, it is possible to keep the average value of the pulse output voltage Vo that is applied to the relay coil 21a at a predetermined target average value Voave. It is thus possible to standardize the relay coil 21a regardless of the voltage value of the direct-current input voltage Vi, a great advantage in terms of cost and management.

Moreover, in the pulse control device 10 of this embodiment, the pulse output voltage Vo is fed as it is to the relay coil 21a without being smoothed. It is thus possible to eliminate the need for a smoothing filter (discrete components such as a coil and a capacitor) that are externally connected to the pulse control device 10, and thus to reduce the circuit area and achieve cost reduction.

With a configuration where the pulse output voltage Vo is fed directly to the relay coil 21a, there is no need to perform driving at so high a frequency as in common DC-DC converters. Thus, it is possible to lower the switching frequency Fsw of the pulse output voltage Vo, and thereby to resolve the problem of heat generation. It is also possible to greatly shrink the chips integrated into the pulse control device 10 compared with common DC-DC converters.

Furthermore, in the pulse control device 10, a feedback input of the pulse output voltage Vo is received to perform output feedback control on it. Thus, it is possible to reduce, compared with conventional open control (such as that disclosed in Patent Document 1), variation of the pulse output voltage Vo.

Now, the configuration of the different blocks in the pulse control device 10 will be described in detail by way of practical examples.

<Low-Pass Filter>

Figure 4:
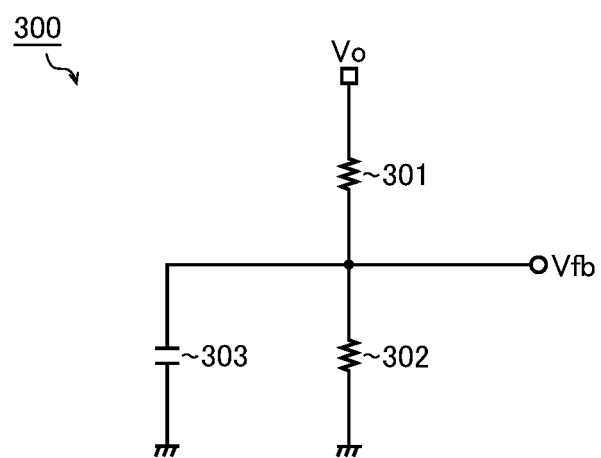
FIG. 4 is a diagram showing one configuration example of a low-pass filter.

FIG. 4 is a diagram showing one configuration example of the low-pass filter 300. The low-pass filter 300 of this configuration example includes resistors 301 and 302 (with resistance values R301 and R302 respectively) and a capacitor 303. The resistor 301 is connected between the feedback input terminal of the pulse output voltage Vo (that is, the external terminal T12) and the output terminal of the feedback voltage Vfb. The resistor 302 and the capacitor 303 are connected in parallel between the output terminal of the feedback voltage Vfb and the grounded terminal.

The resistors 301 and 302 function as a voltage dividing means for generating a division voltage (=[R302/(R301+R302)]×Vo) of the pulse output voltage Vo, and the capacitor 303 functions as a smoothing means for blunting the division voltage to generate the feedback voltage Vfb with a triangular waveform. Thus, the feedback voltage Vfb results from a division voltage of the pulse output voltage Vo being blunted with the capacitor 303, and the low-pass filter 300 includes no coil for smoothing.

In a case where the high level (=Vi) of the pulse output voltage Vo falls within the input dynamic range of the comparator 220, the resistors 301 and 302 may be omitted, in which case the pulse output voltage Vo itself can be blunted with the capacitor 303.

<On-Time Setter>

Figure 5:
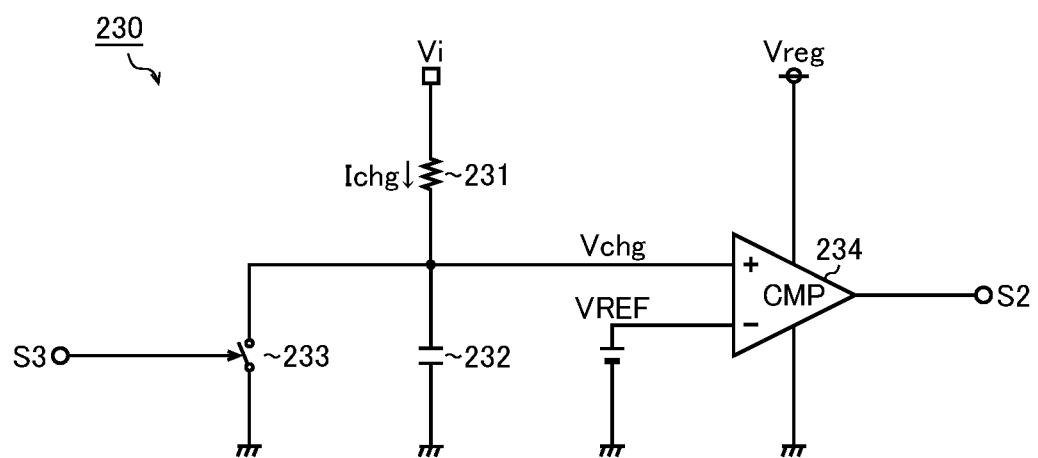
FIG. 5 is a diagram showing one configuration example of an on-time setter.

FIG. 5 is a diagram showing one configuration example of the on-time setter 230. The on-time setter 230 of this configuration example includes a resistor 231, a capacitor 232, a switch 233, and a comparator 234.

The resistor 231 is connected between the application terminal of the direct-current input voltage Vi (that is, the external terminal T11) and the output terminal of a charge voltage Vchg. The capacitor 232 and the switch 233 are connected in parallel between the output terminal of the charge voltage Vchg and the grounded terminal. The control terminal of the switch 233 is connected to the application terminal of the gate control signal S3.

The switch 233 functions as a charge/discharge switch that switches whether to charge or discharge the capacitor 232 in accordance with the gate control signal S3 (and hence according to the on/off states of the high-side and lower-side switches 110 and 120). Specifically, the switch 233 is off when the gate control signal S3 is at high level (a logic level indicating the high-side switch 110 being on and the low-side switch 120 being off), and is on when the gate control signal S3 is at low level (a logic level indicating the high-side switch 110 being off and the low-side switch 120 being on).

When the switch 233 is off, the capacitor 232 is charged by a charge current ichg that passes from the application terminal of the direct-current input voltage Vi via the resistor 231, and thus the charge voltage Vchg rises. Here, the charge voltage Vchg increases with a gradient commensurate with the direct-current input voltage Vi. On the other hand, when the switch 233 is on, the capacitor 232 is discharged via the switch 233, and thus the charge voltage Vchg falls quickly down to the ground voltage GND.

The comparator 234 generates the reset signal S2 by comparing the charge voltage Vchg, which is fed to the non-inverting input terminal (+) of the comparator 234, with a reference voltage VREF (for example, a voltage, such as a band-gap reference voltage, that does not depend on variation of the supplied power or of temperature), which is fed to the inverting input terminal (−) of the comparator 234. The reset signal S2 is at high level (=Vreg) when the charge voltage Vchg is higher than the reference voltage VREF, and is at low level (=GND) when the charge voltage Vchg is lower than the reference voltage VREF. The reference voltage VREF may be equal to, or different from, the reference voltage Vref (FIG. 2) mentioned previously.

<Gate Controller>

Figure 6:
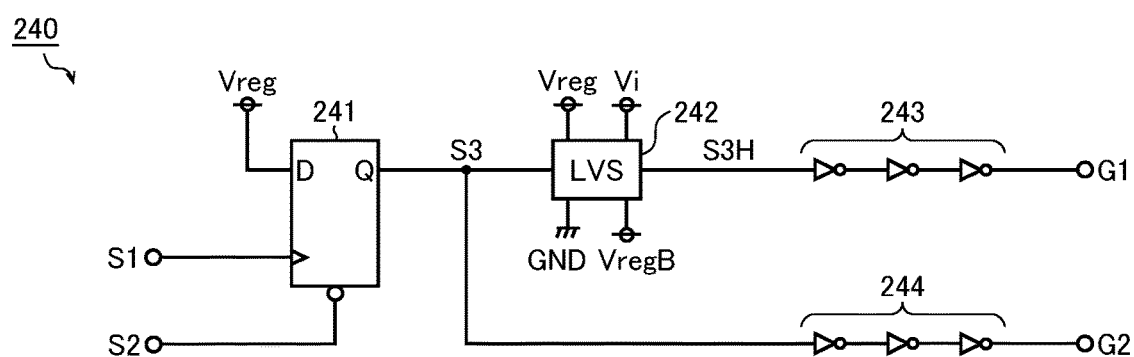
FIG. 6 is a diagram showing one configuration example of a gate controller.

FIG. 6 is a diagram showing one configuration example of the gate controller 240. The gate controller 240 of this configuration example includes a D flip-flop 241, a level shifter 242, and drivers 243 and 244.

The D flip-flop 241 sets the gate control signal S3, which appears at the output terminal Q of the D flip-flop 241, to high level (=an internal supply voltage Vreg, which is applied to the data terminal D of the D flip-flop 241) according to the set signal S1 (for example, at a rising edge in it), which is fed to the clock terminal of the D flip-flop 241. The D flip-flop 241 resets the gate control signal S3, which appears at the output terminal Q of the D flip-flop 241, to low level (=GND) according to the reset signal S2 (for example, at a rising edge in it), which is fed to the reset terminal of the D flip-flop 241. Instead of the D flip-flop 241, an RS flip-flop may be used.

The level shifter 242 receives the gate control signal S3, which is pulse-driven between Vreg and GND, and outputs a level-shifted gate control signal S3H that is pulse-driven between Vi and VregB.

The driver 243 receives the gate control signal S3H, and generates the high-side gate signal G1. In the illustrated example, the driver 243 is composed of three stages of inverters. Accordingly, the high-side gate signal G1 is at low level (=VregB) when the gate control signal S3H is at high level, and is at high level (=Vi) when the gate control signal S3H is at low level.

On the other hand, the driver 244 receives the gate control signal S3, and generates the low-side gate signal G2. In the illustrated example, the driver 244 is composed of three stages of inverters. Accordingly, the low-side gate signal G2 is at low level (=GND) when the gate control signal S3 is at high level, and is at high level (=Vreg) when the gate control signal S3 is at low level.

Thus, the high-side and low-side gate signals G1 and G2 have the same logic level, and accordingly the high-side and lower-side switches 110 and 120 are so controlled that they turn on and off complementarily (exclusively). In the present description, the term "complementarily (exclusively)" covers not only operation in which the on/off states of the high-side and lower-side switches 110 and 120 are reversed completely but also operation in which, to prevent a through current, a predetermined delay is secured in the timing of on/off transition of the high-side and lower-side switches 110 and 120 (thereby to leave periods in which the transistors are both off).

<Output Feedback Control Operation>

Figure 7:
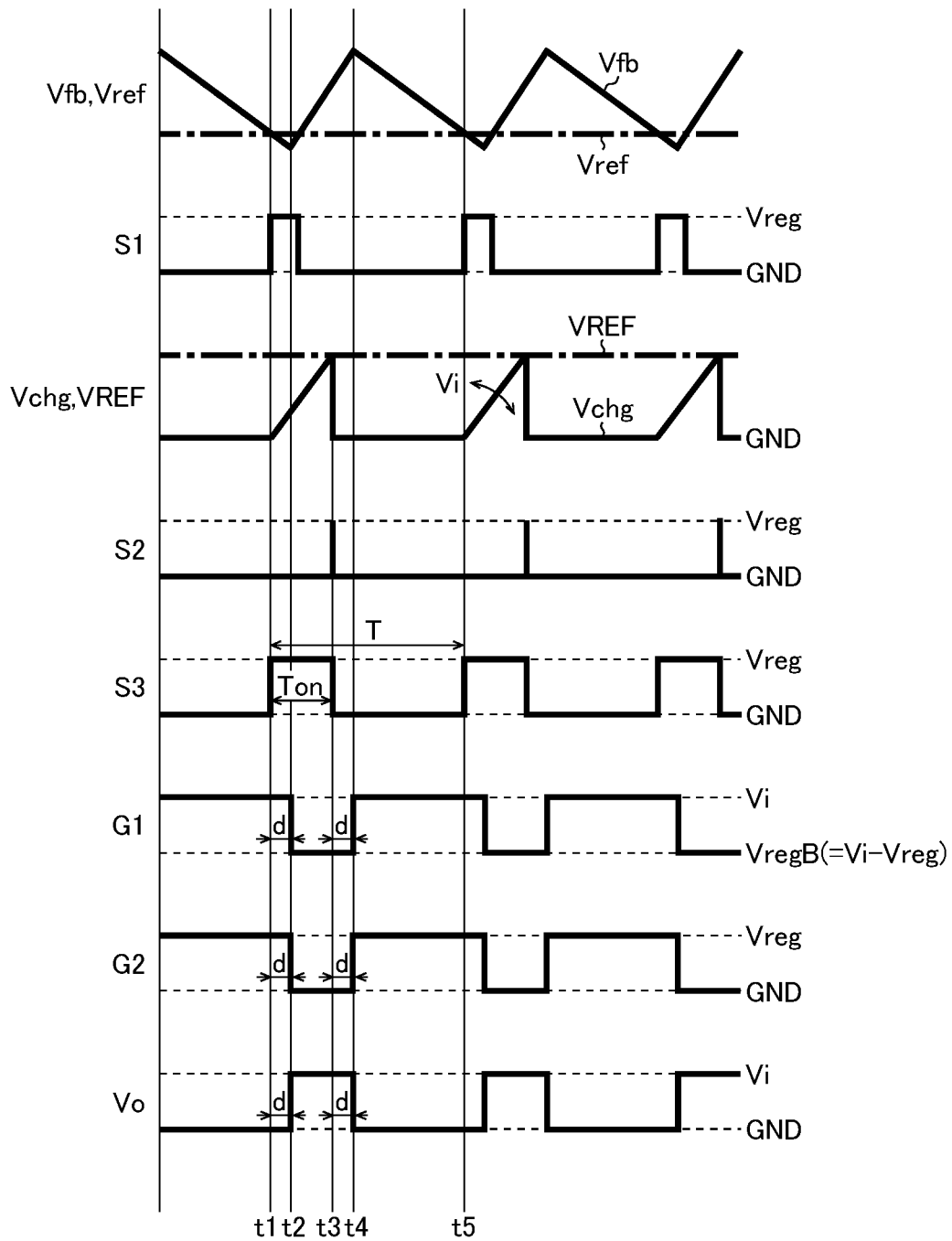
FIG. 7 is a timing chart showing one example of output feedback control operation.

FIG. 7 is a timing chart showing one example of the output feedback control operation by the pulse control device 10, depicting, from top down, the feedback voltage Vfb (solid line) and reference voltage Vref (dash-dot line), the set signal S1, the charge voltage Vchg (solid line) and reference voltage VREF (dash-dot line), the reset signal S2, the gate control signal S3, the high-side gate signal G1, the low-side gate signal G2, and the pulse output voltage Vo.

At time point t1, that is, when, during an off-period (G1=G2=H) of the high-side switch 110, the feedback voltage Vfb falls down to the reference voltage Vref (corresponding to a bottom detection threshold value), the set signal S1 rises from low level (=GND) to high level (=Vreg), and thus the gate control signal S3 is set from low level (=GND) to high level (=Vreg).

Accordingly, after time point t1, when a predetermined delay time d (chiefly the signal delay time in the drivers 243 and 244) passes, that is, at time point t2, the high-side and low-side gate signals G1 and G2 both turn to low level (G1=VregB, G2=GND). Thus, the high-side switch 110 turns on, and the low-side switch 120 turns off. As a result, the pulse output voltage Vo rises from low level (=GND) to high level (=Vi), and thus the feedback voltage Vfb, which has thus far been falling, starts to rise. The set signal S1 returns to low level when, during an on-period (G1=G2=L) of the high-side switch 110, the feedback voltage Vfb rises up to the reference voltage Vref.

At time point t1, as a result of the gate control signal S3 turning to high level, the switch 233 in the on-time setter 230 turns off. Thus, the capacitor 232 starts to be charged by the charge current ichg, and consequently the charge voltage Vchg rises with a gradient commensurate with the direct-current input voltage Vi.

Then, at time point t3, that is, when the charge voltage Vchg rises up to the reference voltage VREF (corresponding to an expiration detection threshold value for the on-period Ton), the reset signal S2 rises from low level (=GND) to high level (=Vreg), and thus the gate control signal S3 is reset from high level to low level.

Accordingly, after time point t3, when the delay time d passes, that is, at time point t4, the high-side and low-side gate signals G1 and G2 both turn to high level (G1=Vi, G2=Vreg). Thus, the high-side switch 110 turns off, and the low-side switch 120 turns on. As a result, the pulse output voltage Vo falls from high level to low level, and thus the feedback voltage Vfb, which has thus far been rising, starts back to fall.

Moreover, at time point t3, as the result of the gate control signal S3 turning to low level, the switch 233 in the on-time setter 230 turns on. Thus, the capacitor 232 is discharged via the switch 233, and consequently the charge voltage Vchg falls quickly down to the ground voltage GND. Thus, the reset signal S2 falls to low level without delay.

After time point t5, operation similar to what has been described is repeated, and thereby the on-duty Don (=Ton/T, i.e., the proportion of the on-period Ton in the switching period T) of the pulse output voltage Vo is controlled such that the average value of the pulse output voltage Vo remains at the predetermined target average value Voave.

Here, in the on-time setter 230, the on-period Ton (corresponding to the time that elapses after the charge voltage Vchg starts to rise until it becomes higher than the reference voltage VREF) is set not as a fixed value but as a variable value that is commensurate with the direct-current input voltage Vi.

Specifically, in the on-time setter 230, the higher the direct-current input voltage Vi, the steeper the gradient of the charge voltage Vchg, and thus the shorter the on-period Ton. Reversely, the lower the direct-current input voltage Vi, the gentler the gradient of the charge voltage Vchg, and thus the longer the on-period Ton. Thus, between the on-period Ton and the direct-current input voltage Vi, formula (1) below holds.

$$Ton = \alpha/Vi \text{ (where } \alpha \text{ represents a proportionality constant)} \quad (1)$$

On the other hand, the on-duty Don (=Ton/T) of the pulse output voltage Vo is given, as expressed by formula (2) below, as the ratio of the target average value Voave of the pulse output voltage Vo to the direct-current input voltage Vi.

$$Don = Ton/T = Voave/Vi \quad (2)$$

Based on formulae (1) and (2) above, the switching period T of the pulse output voltage Vo is given by formula (3) below.

$$T = (\alpha/Vi) \times (Vi/Voave) = \alpha/Voave \quad (3)$$

Here, considering that the proportionality constant $\alpha$ and the target average value Voave of the pulse output voltage Vo are both constant values, it will be seen that the switching period T (and hence the switching frequency Fsw (=1/T)) is constant. It is preferable that the switching frequency Fsw be set to be higher (for example, Fsw=100 kHz or higher) than the human audible frequency range (generally 20 Hz to 20 kHz). This configuration helps resolve the problem of audible noise.

As described above, this embodiment deals with, as an example, a configuration where the pulse output voltage Vo is subjected to PWM control that, while employing a bottom detection fixed on-time method, which is one type of hysteresis control method, leaves the on-period Ton dependent on the direct-current input voltage Vi. In cases where some variation of the switching frequency Fsw is permissible, a configuration is also possible where the pulse output voltage Vo is subjected to PFM (pulse-frequency modulation) control where the on-period Ton is a fixed value. Instead of a bottom detection fixed on-time method, a peak detection set off-time method may be adopted.

<Second Embodiment>

Figure 8:
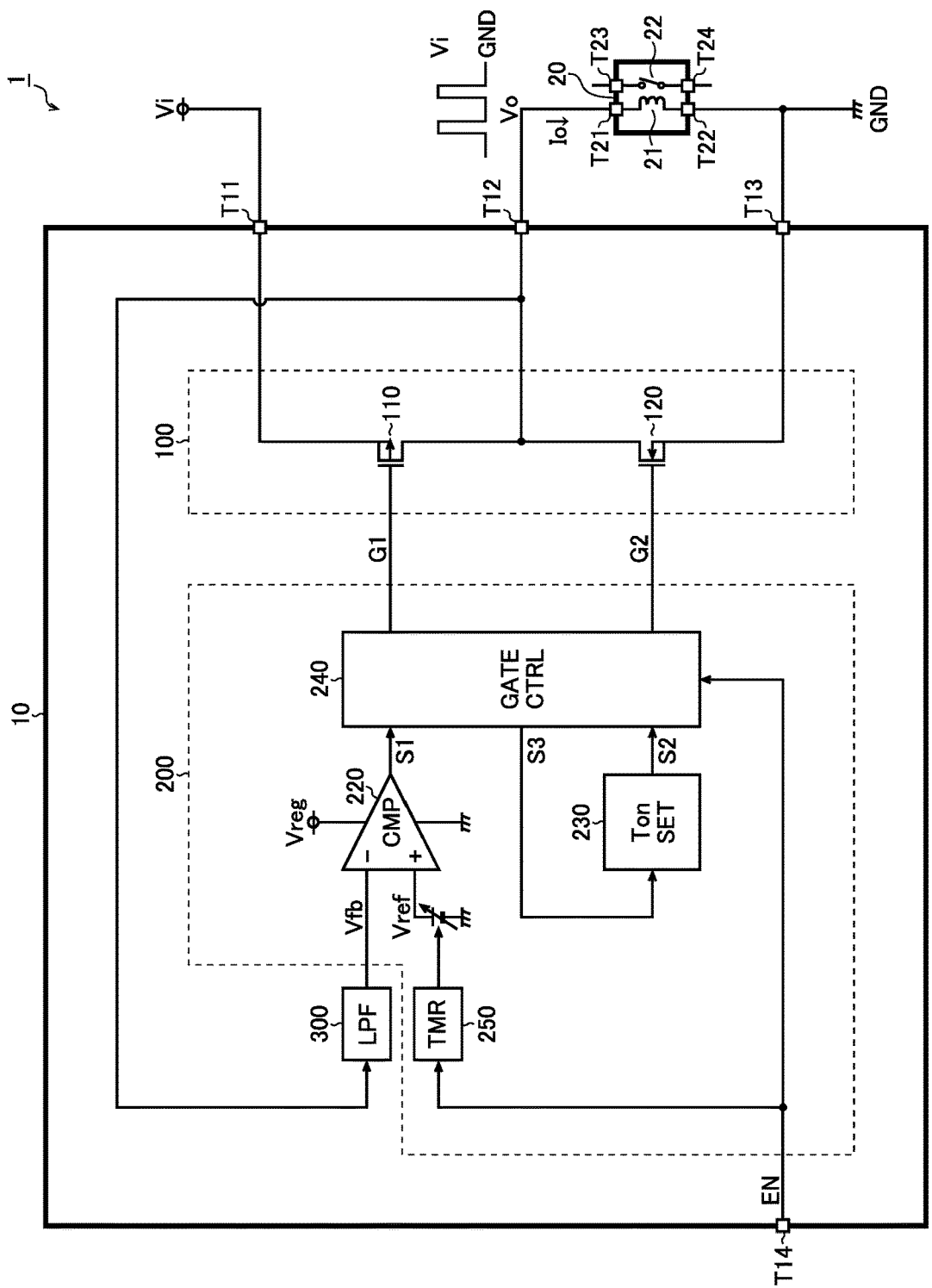
FIG. 8 is a diagram showing, as a second embodiment, an electric appliance provided with a mechanical relay.

FIG. 8 is a diagram showing, as a second embodiment, an electric appliance provided with a mechanical relay. The electric appliance 1 of this embodiment, while being based on the first embodiment (FIG. 2) described previously, is characterized in that the output feedback controller 200 in the pulse control device 10 further includes a timer 250. Accordingly, such components as are similar to those in the first embodiment are identified by the same reference signs as in FIG. 2, and no overlapping description will be repeated. The following description focuses on features unique to this embodiment.

The timer 250 starts counting operation when the enable signal EN is raised to high level (a logic level indicating coil being energized), and controls the switching of the reference voltage Vref in accordance with the count value. This will now be described in detail by way of specific examples.

Figure 9:
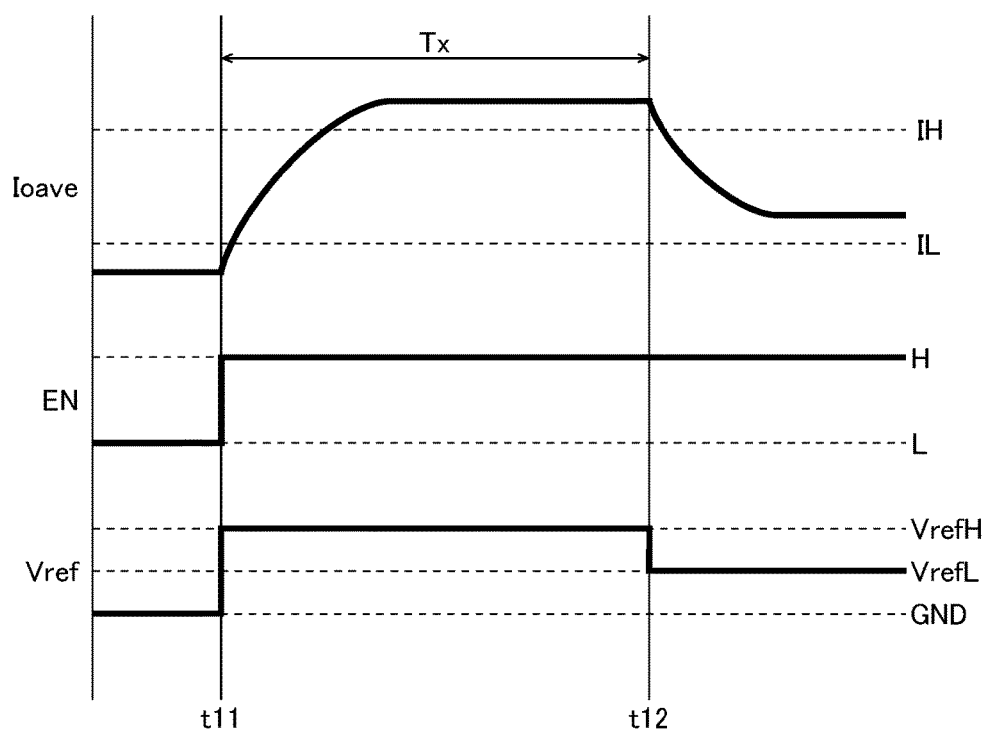
FIG. 9 is a timing chart showing one example of reference voltage switching operation.

FIG. 9 is a timing chart showing one example of reference voltage switching operation by the timer 250, depicting, from top down, the average excitation current Ioave (which is the average value of the excitation current Io), the enable signal EN, and the reference voltage Vref.

At time point t11, when the enable signal EN is raised to high level, the timer 250 sets the reference voltage Vref at a high-side voltage value VrefH, and starts to count an overexcitation period Tx. Here, the high-side voltage value VrefH is set such that the average excitation current Ioave is higher than the operating current value IH (=Vi×Don/RL, where RL represents the resistor component value of the relay coil 21*a*). Thus, when the enable signal EN is raised to high level, the mechanical relay 20 can be switched on reliably.

Thereafter, at time point t12, that is, when the overexcitation period Tx passes, the timer 250 drops the reference voltage Vref down to a low-side voltage value VrefL (<VrefH). The low-side voltage value VrefL is set such that the average excitation current Ioave does not become lower than the recovery current value IL. Thus, while the enable signal EN remains at high level, the mechanical relay 20 can be kept on with reduced power consumption.

This embodiment deals with, as an example, a configuration where the timer 250 is used to control the switching of the reference voltage Vref. Instead, for example, a means for sensing the excitation current Io may be provided so that the reference voltage Vref is kept at the high-side voltage value VrefH until the average excitation current Ioave becomes higher than the operating current value IH and thereafter the reference voltage Vref is dropped down to the low-side voltage value VrefL.

Switching the reference voltage Vref is tantamount to switching the target average value Voave of the pulse output voltage Vo. In view of this, the output feedback controller 200 can be configured in any way so long as it sets the target average value Voave of the pulse output voltage Vo at a first level after the pulse output voltage Vo starts to be generated until the average excitation current Ioave exceeds at least the operating current value IH and it thereafter sets the target average value Voave of the pulse output voltage Vo at a second level lower than the first level within a range where the average excitation current Ioave does not drop below the recovery current value IL.

<Third Embodiment>

Figure 10:
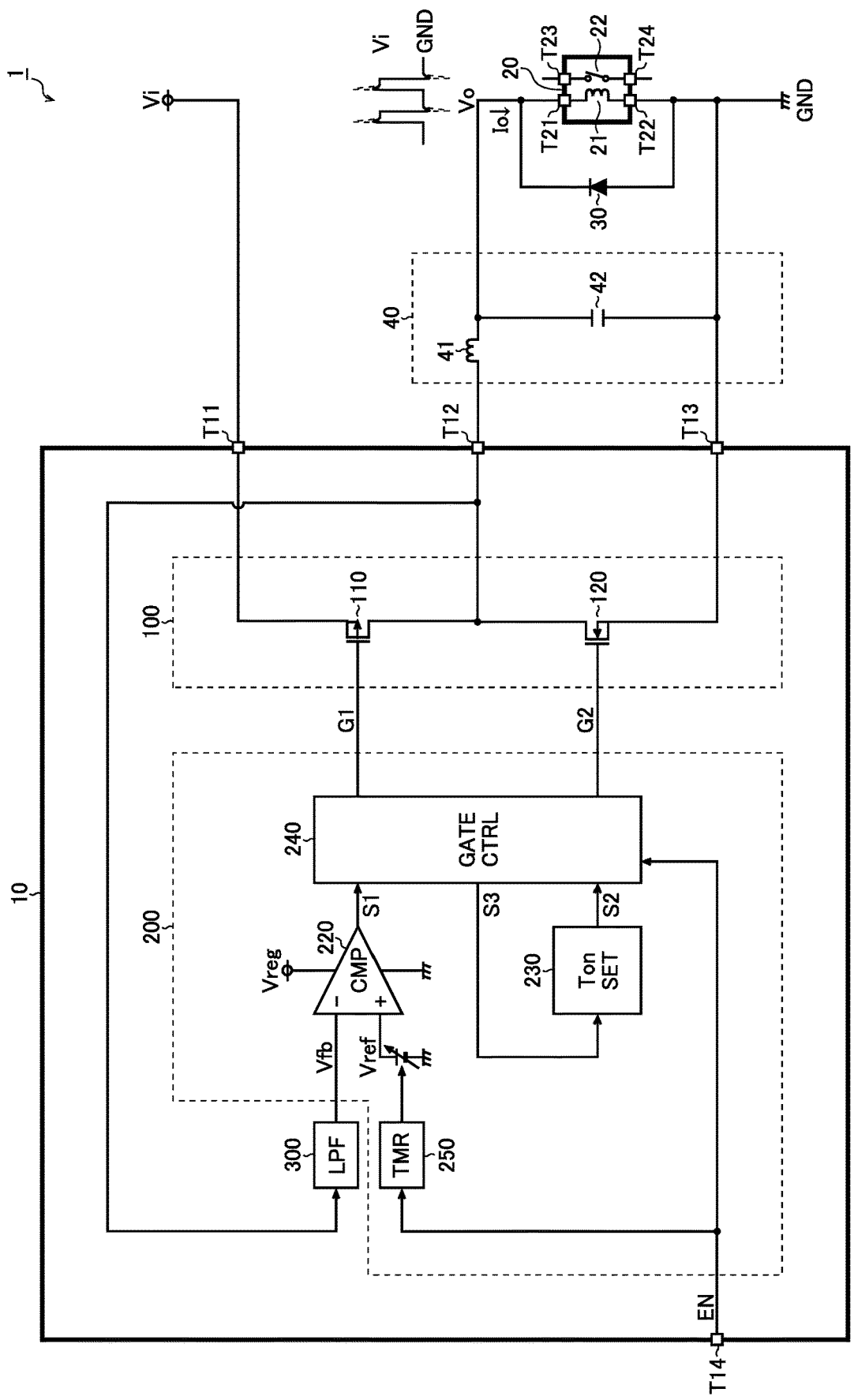
FIG. 10 is a diagram showing, as a third embodiment, an electric appliance provided with a mechanical relay.

FIG. 10 is a diagram showing, as a third embodiment, an electric appliance provided with a mechanical relay. The electric appliance 1 of this embodiment, while being based on the second embodiment (FIG. 8) described previously, is characterized in that it further includes a regeneration diode 30 and a filter 40 as discrete components that are externally connected to the pulse control device 10. Accordingly, such components as are similar to those in the second embodiment are identified by the same reference signs as in FIG. 8, and no overlapping description will be repeated. The following description focuses on features unique to the third embodiment.

In a case where a regeneration diode 30 is connected in parallel with the mechanical relay 20 (in particular, the relay coil 21*a*), it is preferable that, as shown in FIG. 10, a filter 40 be provided that eliminates spike noise in the pulse output voltage Vo. As the filter 40, an LC filter including a coil 41 and a capacitor 42 can be used. This configuration eliminates the need to give the regeneration diode 30 an unnecessarily high withstand voltage, and thus helps achieve cost reduction with the electric appliance 1.

The filter 40 is intended to eliminate noise from the pulse output voltage Vo, and is not intended to smooth the pulse output voltage Vo. Accordingly, the L and C values in the filter 40 can be one-tenth or less of those in an output smoothing filter in DC-DC converters.

Specifically, though depending on the constants of the mechanical relay 20, assuming that the switching frequency Fsw=100 kHz and the ripple voltage ΔVo/2=1 V, an output smoothing filter in a DC-DC converter requires, roughly, (L, C)=(33 μH, 330 μF). By contrast, in the filter 40 in this embodiment, roughly, (L, C)=(3.3 μH, 22 μF), (5 μH, 10 μF), or (8 µH, 5 µf) suffice. Increasing the permissible ripple voltage or increasing the frequency helps further reduce (L, C) in the filter 40.

Moreover, in an output smoothing filter in a DC-DC converter, the LC values there affect the phase design, and this makes it difficult to change them freely. By contrast, in the filter 40 in this embodiment, the LC values there are so small that they do not affect the stability of the system. Thus, the LC values in the filter 40 can be changed freely according to the use of the mechanical relay 20 (and hence the user's intention).

This embodiment deals with an example that is based on the second embodiment (FIG. 8). Needless to say, a configuration based rather on the first embodiment (FIG. 2) and additionally including a regeneration diode 30 and a filter 40 is also possible.

<Fourth Embodiment>

Figure 11:
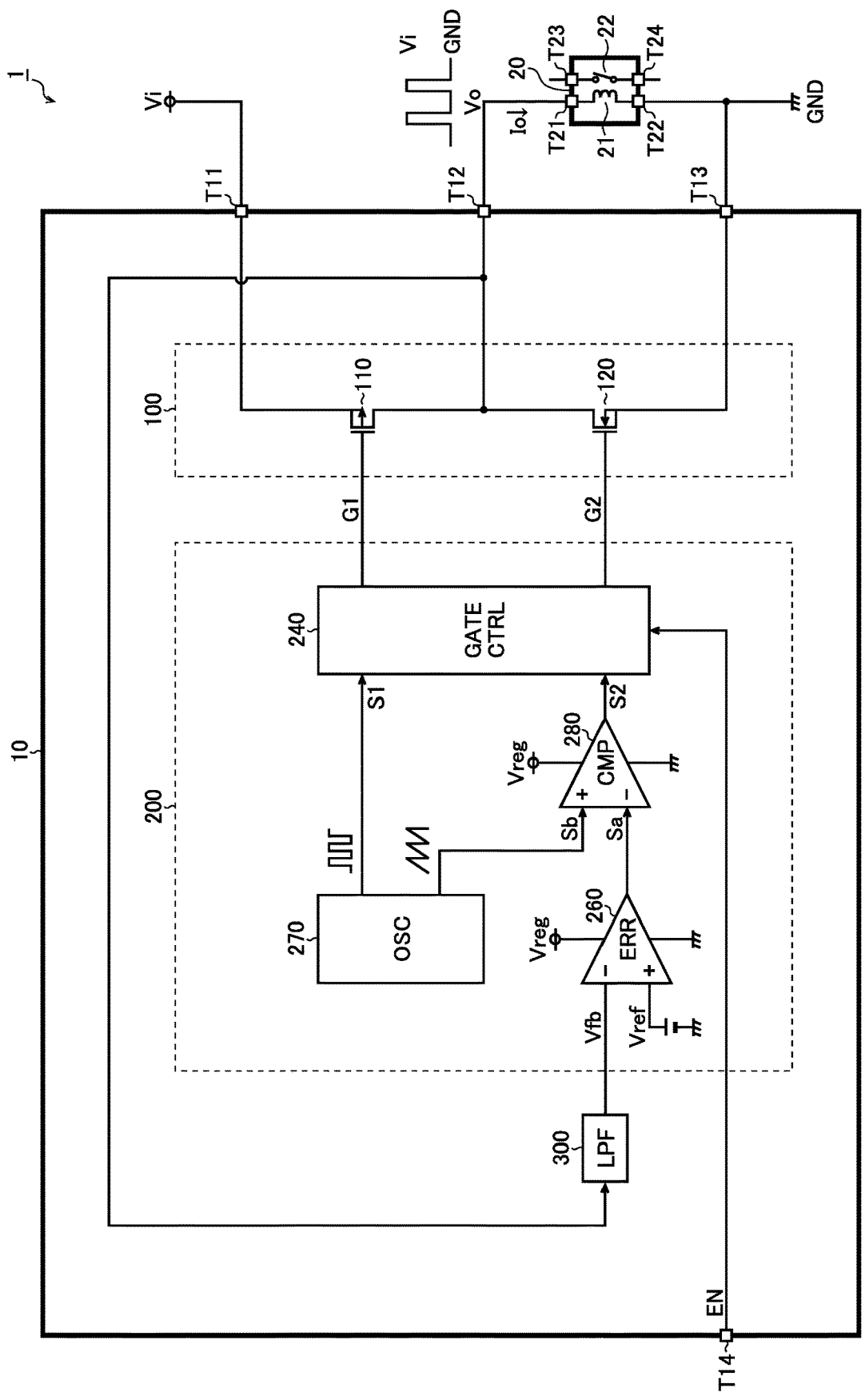
FIG. 11 is a diagram showing, as a fourth embodiment, an electric appliance provided with a mechanical relay.

FIG. 11 is a diagram showing, as a fourth embodiment, an electric appliance provided with a mechanical relay. The electric appliance 1 of this embodiment, while being based on the first embodiment (FIG. 2) described previously, is characterized in that, as the output feedback control method in the output feedback controller 200, not a hysteresis control method (bottom detection fixed on-time method) but a voltage mode control method is employed. Accordingly, such components as are similar to those in the first embodiment are identified by the same reference signs as in FIG. 2, and no overlapping description will be repeated. The following description focuses on features unique to the fourth embodiment.

In the pulse control device 10 in this embodiment, where a voltage mode control method is adopted, the output feedback controller 200 includes, instead of the comparator 220 and the on-time setter 230 described previously, an error amplifier 260, an oscillator 270, and a comparator 280.

The error amplifier 260 generates an error signal Sa that is commensurate with the difference between the feedback voltage Vfb, which is fed to the inverting input terminal (−) of the error amplifier 260, and the reference voltage Vref (for example, a voltage, such as a band-gap reference voltage, that does not depend on variation of the supplied power or of temperature), which is fed to the non-inverting input terminal (+) of the error amplifier 260. The error signal Sa is higher the larger the difference between the feedback voltage Vfb and the reference voltage Vref, and is lower the smaller the difference between the feedback voltage Vfb and the reference voltage Vref.

The oscillator 270 generates, at a predetermined switching frequency Fsw, a set signal S1 with a square waveform and a slope signal Sb with a triangular, sawtooth-shaped, or nth-order slope waveform.

The comparator 280 generates a reset signal S2 by comparing the error signal Sa, which is fed to the inverting input terminal (−) of the comparator 280, with the slope signal Sb, which is fed to the non-inverting input terminal (+) of the comparator 280. The reset signal S2 is at high level (=Vreg) when the slope signal Sb is higher than the error signal Sa, and is at low level (=GND) otherwise, that is, when the slope signal Sb is lower than the error signal Sa.

With this circuit configuration, in the output feedback controller 200, PWM control of the pulse output voltage Vo is performed by a voltage mode control method such that the average value of the pulse output voltage Vo remains at the predetermined target average value Voave.

This embodiment deals with an example based on the first embodiment (FIG. 2). As in the second embodiment (FIG. 8), a function of switching the reference voltage Vref may be additionally implemented.

This embodiment deals with an example where a voltage mode control method is adopted. Instead, a current mode control method may be adopted. In that case, for example, the error signal Sa or the slope signal Sb can be given an offset by use of a current sense signal that is commensurate with the excitation current Io.

So long as output feedback control can be performed by receiving a feedback input of an unsmoothed pulse output voltage Vo as described above, there is no restriction whatsoever on the method for achieving the output feedback control; that is, it is possible to adopt any of a hysteresis control method, a voltage mode control method, and a current mode control method.

<Fifth Embodiment>

Figure 12:
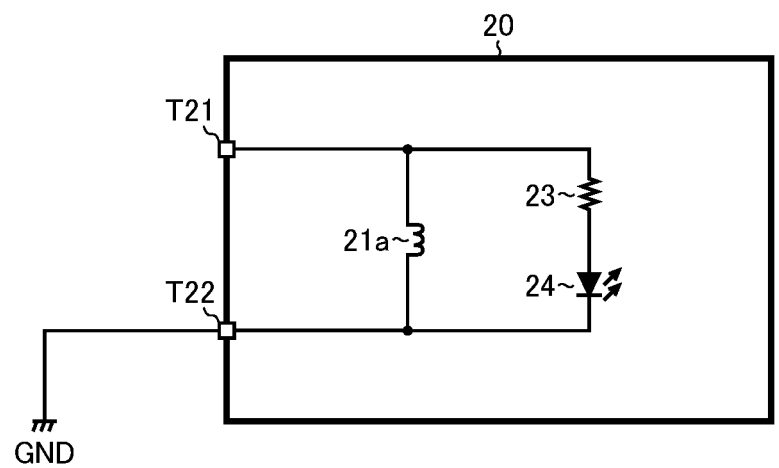
FIG. 12 is a diagram showing one example of a mechanical relay provided with an LED.

FIG. 12 is a diagram showing one example of a mechanical relay provided with a light-emitting diode (hereinafter "LED"). The mechanical relay 20 of this configuration example includes, in addition to the electromagnetic section 21 and the contact mechanism section 22 described previously (only the relay coil 21a is shown in FIG. 12), a resistor 23 and an LED 24. The first terminal of the resistor 23 is, along with the first terminal of the relay coil 21a, connected to the external terminal T21. The second terminal of the resistor 23 is connected to the anode of the LED 24. The cathode of the LED 24 is connected to the second terminal of the relay coil 21a and also to the external terminal T22.

Figure 13:
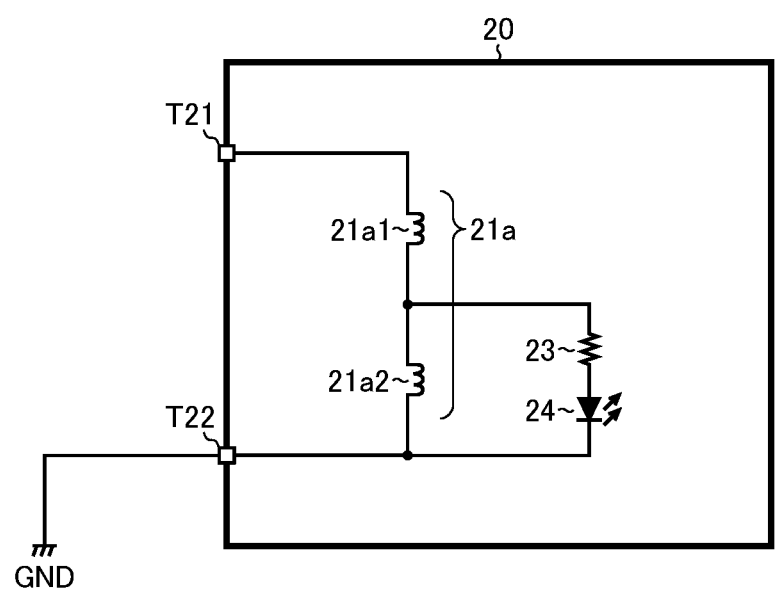
FIG. 13 is a diagram showing another example of a mechanical relay provided with an LED.

FIG. 13 is a diagram showing another example of a mechanical relay provided with an LED. The mechanical relay 20 of this configuration example, like the previous one in FIG. 12, includes a resistor 23 and an LED 24. In the mechanical relay 20 of this configuration example, the relay coil 21a is divided into relay coils 21a1 and 21a2, and in parallel with the relay coil 21a2, the resistor 23 and the LED 24 are connected.

Regardless of which of the above configurations to adopt, with a mechanical relay 20 provided with an LED 24, when the relay coil 21a is energized, the LED 24 is lit. Thus, by visually checking whether the LED 24 is lit or extinguished, it is possible to check the operation and failure of the mechanical relay 20.

Inconveniently, however, if the pulse output voltage Vo is applied directly to such a mechanical relay 20 incorporating an LED, every time the pulse output voltage Vo rises from low level (=GND) to high level (=Vi), an excessively high current passes in the LED 24, and this may destroy the LED 24. A description will be given below of a novel embodiment that permits safe lighting of the LED 24 while achieving pulse-driving of the mechanical relay 20.

Figure 14:
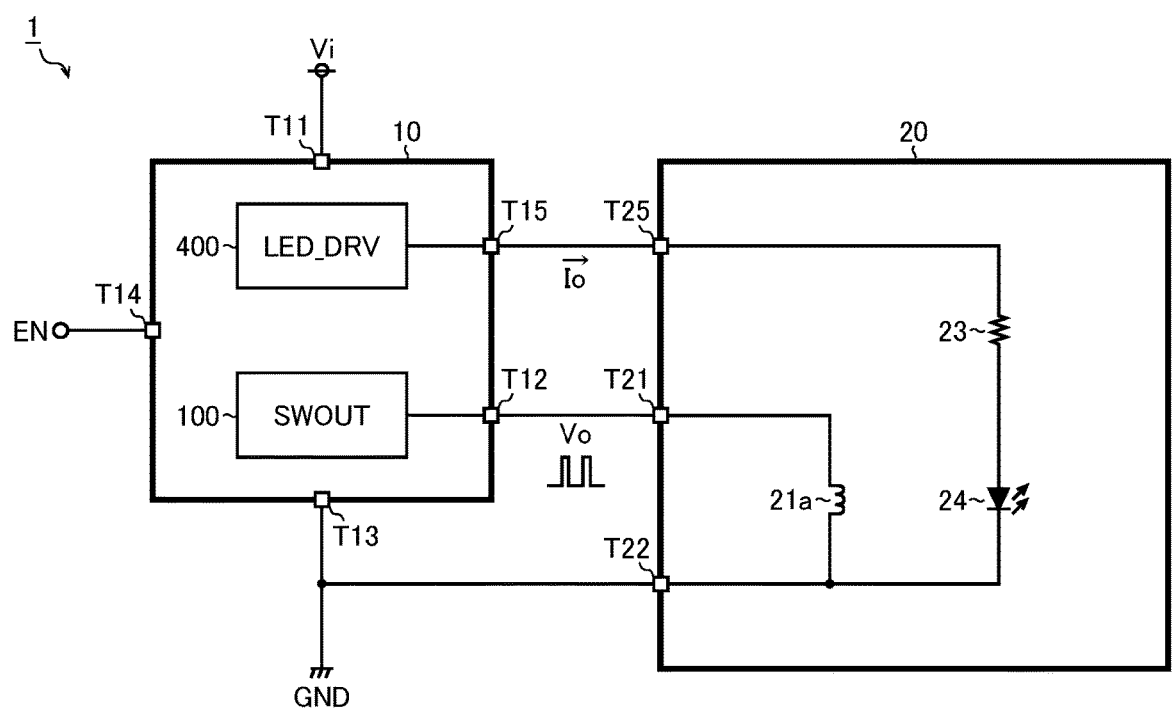
FIG. 14 is a diagram showing, as a fifth embodiment, an electric appliance provided with a mechanical relay.

FIG. 14 is a diagram showing, as a fifth embodiment, an electric appliance provided with a mechanical relay. The electric appliance 1 of this embodiment includes a pulse control device 10 and a mechanical relay 20. In this respect, the electric appliance 1 here is no different from those of the first to fourth embodiments described thus far. It should be noted that some of the already described components (such as the output feedback controller 200, the low-pass filter 300, and the contact mechanism section 22) are, unless necessary, omitted from illustration.

On the other hand, the mechanical relay 20, as in FIGS. 12 and 13 discussed previously, includes a resistor 23 and a LED 24, and the pulse control device 10 further includes an LED driver 400 as a means for safely lighting the LED 24. The pulse control device 10 and the mechanical relay 20 further include external terminals T15 and T25, respectively, for feeding an output current Io from the LED driver 400 to the LED 24. The following description focuses on these differences.

The LED driver 400 (corresponding to a light-emitting element driver) generates a constant output current Io throughout the period in which the pulse output voltage Vo is fed from the switching output stage 100 to the relay coil 21a. The output current Io is fed from the external terminal T15 of the pulse control device 10 to the external terminal T25 of the mechanical relay 20.

The first terminal of the resistor 23 is connected, not to the external terminal T21 to which the first terminal of the relay coil 21a is connected, but to the additionally provided external terminal T25. The second terminal of the resistor 23 is connected to the anode of the LED 24. The cathode of the LED 24 is connected, along with the second terminal of the relay coil 21a, to the external terminal T22.

With this configuration, where the LED 24 is separated from the application terminal of the pulse output voltage Vo (that is, from the external terminal T21) and the output current Io is fed across another path, it does not occur that, every time the pulse output voltage Vo rises, an excessive current passes through the LED 24, and thus there is no risk of destroying the LED 24. It is thus possible to safely light the LED 24 while achieving pulse-driving of the mechanical relay 20.

Figure 15:
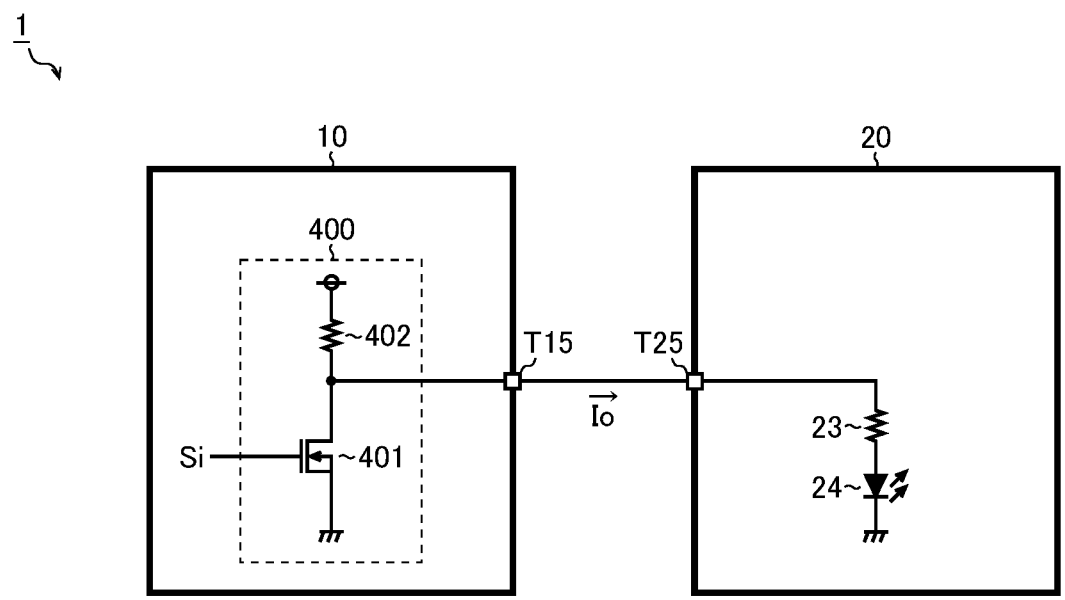
FIG. 15 is a diagram showing one example of an LED driver.

FIG. 15 is a diagram showing one example of the LED driver 400. The LED driver 400 of this configuration example includes an NMOSFET 401 and a resistor 402. The drain of the NMOSFET 401 is connected to the external terminal T15. The source and the back gate of the NMOSFET 401 are connected to the grounded terminal. The gate of the NMOSFET 401 is fed with an input signal Si. The first terminal of the resistor 402 is connected to a power terminal. The second terminal of the resistor 402 is connected to the external terminal T15.

When the input signal Si is at high level, the NMOSFET 401 is on; thus the external terminal T15 conducts to the grounded terminal. Accordingly, no output current Io is fed from the pulse control device 10 to the mechanical relay 20, and thus the LED 24 remains extinguished.

On the other hand, when the input signal Si is at low level, the NMOSFET 401 is off; thus, the external terminal T15 is cut off from the grounded terminal. As a result, the output current Io passes across the current path leading from the power terminal via the resistor 402, the external terminal T15, the external terminal T15, the resistor 23, and the LED 24 to the grounded terminal, and thus the LED 24 remains lit.

By using, as the output stage of the LED driver 400, an open-drain output stage that turns the output current Io on and off in accordance with the input signal Si as described above, it is possible to control the lighting and extinguishing of the LED 24 with an extremely simple circuit configuration.

As the input signal Si, for example, the logical inversion signal of the enable signal EN can be used. In that case, when the enable signal EN is at high level (a logic level indicating the coil being energized), the input signal Si is at low level, and the NMOSFET 401 is off; thus, the output current Io is fed, and the LED 24 is lit. On the other hand, when the enable signal EN is at low level (a logic level indicating the coil not being energized), the input signal Si is at high level and the NMOSFET 401 is on; thus, the output current Io ceases to be fed, and the LED 24 is extinguished.

It is preferable that the LED driver 400 be configured such that whether it is enabled or disabled (whether the external terminal T15 is valid or invalid) can be switched freely from outside the pulse control device 10. When the LED driver 400 is enabled, as mentioned previously, the output current Io is turned on and off in accordance with the input signal Si. On the other hand, when the LED driver 400 is disabled, for example, the external terminal T15 is held at low level.

With this configuration, the driving of the mechanical relay 20, regardless of whether or not it incorporates an LED, can be controlled appropriately. It is thus possible to make the pulse control device 10 more versatile.

<Sixth Embodiment>

Figure 16:
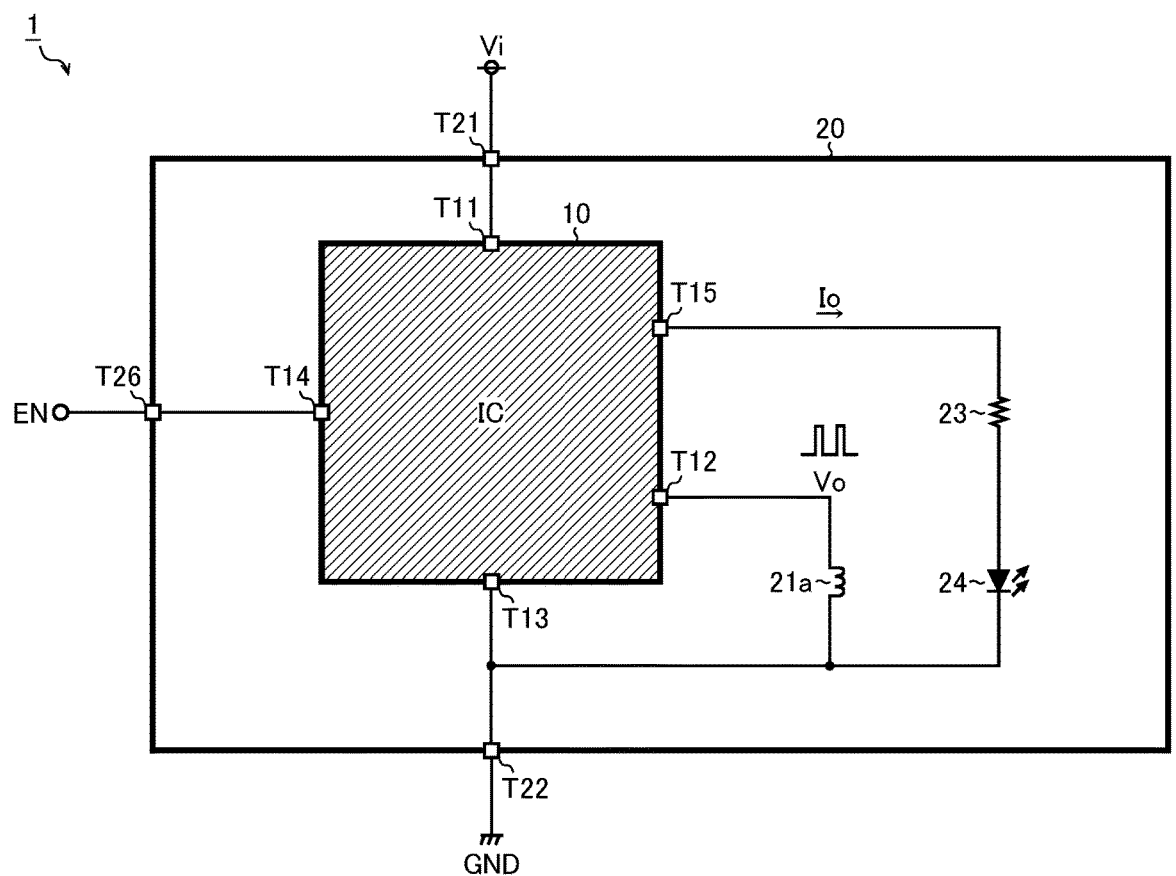
FIG. 16 is a diagram showing, as a sixth embodiment, an electric appliance provided with a mechanical relay.

FIG. 16 is a diagram showing, as a sixth embodiment, an electric appliance provided with a mechanical relay. The electric appliance 1 of this embodiment, while being based on the fifth embodiment (FIG. 14) described previously, is characterized in that the pulse control device 10 is incorporated in the mechanical relay 20. The following description focuses on the interconnection among the external terminals T11 to T15 of the pulse control device 10 as well as the external terminals T21 to T22, and also an external terminal T26 (which is here additionally provided in place of the external terminal T25), of the mechanical relay 20.

The external terminal T11 of the pulse control device 10 is connected, inside the mechanical relay 20, to the external terminal T21 of the mechanical relay 20. The external terminal T21 is connected, outside the mechanical relay 20, to the application terminal of the direct-current input voltage Vi.

The external terminal T12 of the pulse control device 10 is connected, inside the mechanical relay 20, to the first terminal of the relay coil 21a.

The external terminal T13 of the pulse control device 10 is connected, inside the mechanical relay 20, to each of the external terminal T22 of the mechanical relay 20, the second terminal of the relay coil 21a, and the cathode of the LED 24. The external terminal T22 is connected, outside the mechanical relay 20, to the grounded terminal.

The external terminal T14 of the pulse control device 10 is connected, inside the mechanical relay 20, to the external terminal T26 of the mechanical relay 20. The external terminal T26 is connected, outside the mechanical relay 20, to the application terminal of the enable signal EN. However, in a case where no enable signal EN is accepted, the external terminal T26 of the mechanical relay 20 may be omitted, in which case, inside the mechanical relay 20, the external terminals T11 and T14 of the pulse control device 10 can be short-circuited together. With this connection, while the direct-current input voltage Vi is being fed, the external terminal T14 remains at high level (corresponding to EN=H), and thus the relay coil 21a is energized all the time.

The external terminal T15 of the pulse control device 10 is connected, inside the mechanical relay 20, to the first terminal of the resistor 23. The second terminal of the resistor 23 is connected, as mentioned previously, to the anode of the LED 24.

Incorporating the pulse control device 10 in the mechanical relay 20 as described above helps save the mounting area for the pulse control device 10. It is thus possible to make the electric appliance 1 compact and slim.

The fifth and sixth embodiments (FIGS. 14 and 16) described above both deal with an example where the light-emitting element incorporated in the mechanical relay 20 is an LED. This, however, is not meant to limit the type of light-emitting element; an organic EL (electroluminescence) element or the like may instead be used.

<Seventh Embodiment>

Figure 17:
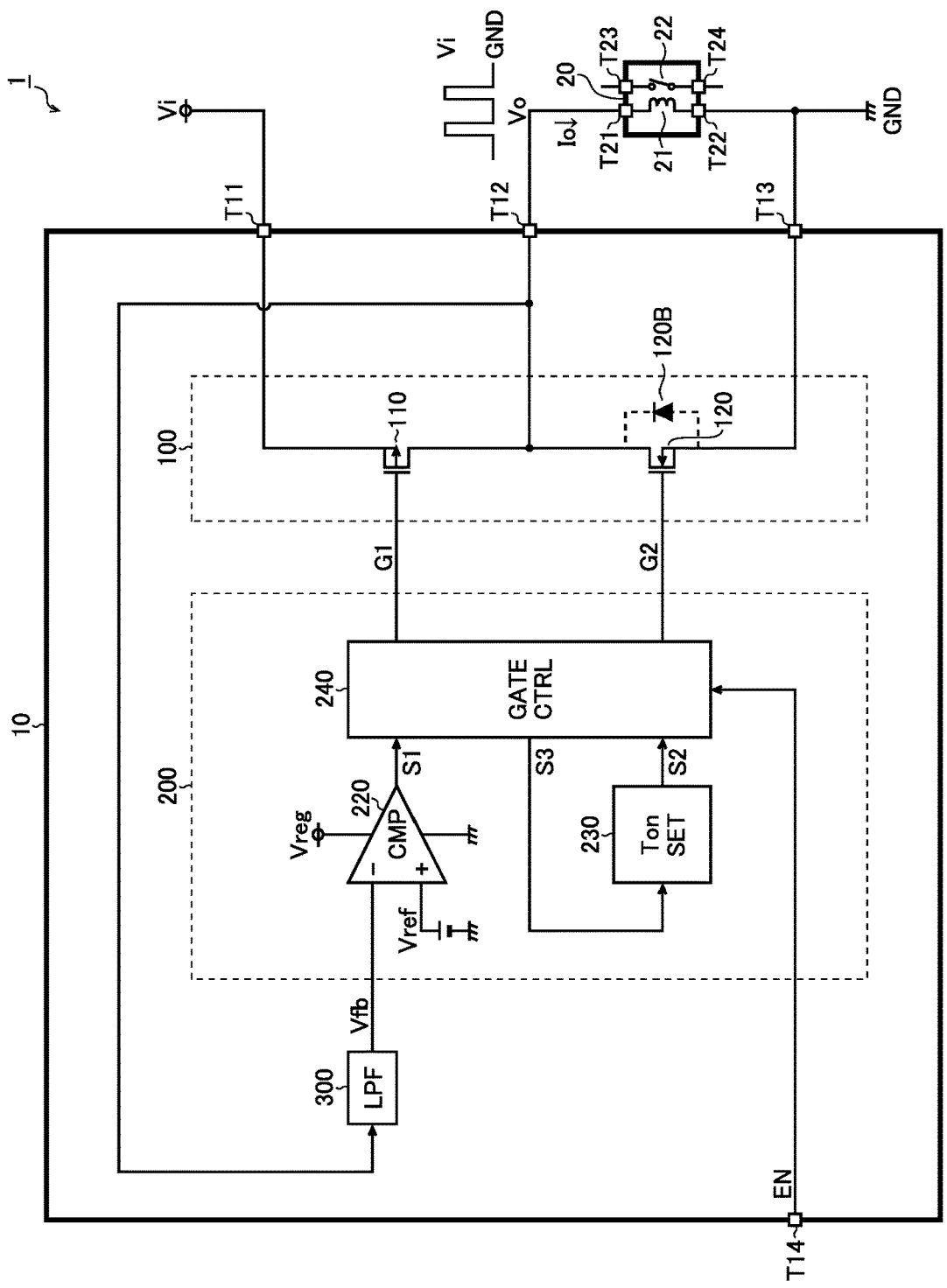
FIG. 17 is a diagram showing, as a seventh embodiment, an electric appliance provided with a mechanical relay.

FIG. 17 is a diagram showing, as a seventh embodiment, an electric appliance provided with a mechanical relay. The electric appliance 1 of this embodiment has basically the same configuration as that of the first embodiment (FIG. 2) described previously, a difference being that a body diode 120B that accompanies the low-side switch 120 in the switching output stage 100 is here shown expressly.

As shown in FIG. 17, the NMOSFET used as the low-side switch 120 (corresponding to a synchronous rectification diode) is accompanied by a body diode 120B, the drain and the source of the former respectively acting as the cathode and the anode of the latter.

The body diode 120B can be used as a regeneration diode for preventing spike noise in the pulse output voltage Vo when the high-side and lower-side switches 110 and 120 are both off, that is, for example when the mechanical relay 20 is turned from on to off, and during a dead time for preventing a through current.

Accordingly, unlike in the third embodiment (FIG. 10) described previously, the regeneration diode 30, which is externally connected, can be omitted. It is thus possible, through reduction of the number of components, to reduce cost and to simplify the design of the electric appliance 1.

There is no need to pass a very high current (several hundred milliamperes) through the electromagnetic section 21 (in particular, the relay coil 21a in it) of the mechanical relay 20. Thus, a higher forward voltage drop across the body diode 120B compared with that across the externally connected regeneration diode 30 does not pose any serious problem.

<Eighth Embodiment>

Figure 18:
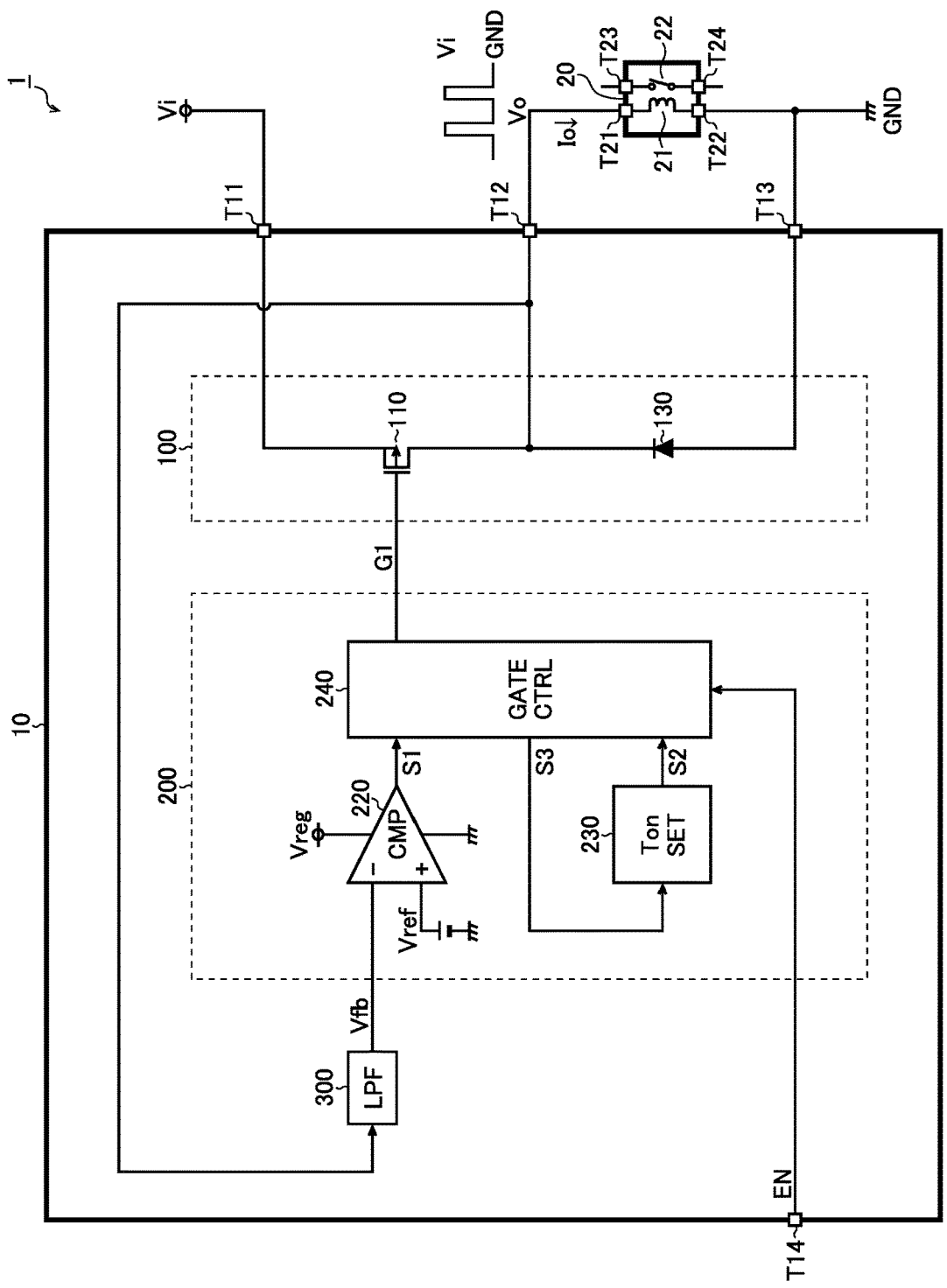
FIG. 18 is a diagram showing, as an eighth embodiment, an electric appliance provided with a mechanical relay.

FIG. 18 is a diagram showing, as an eighth embodiment, an electric appliance provided with a mechanical relay. The electric appliance 1 of this embodiment has basically the same configuration as that of the seventh embodiment (FIG. 17) described previously except that it includes, instead of the low-side switch 120 in the switching output stage 100 (that is, the synchronous rectification transistor), a rectification diode 130. That is, the switching output stage 100 achieves rectification by, instead of synchronous rectification, asynchronous rectification (diode rectification) here.

In this case, the rectification diode 130 is used as a regeneration diode; thus, as with the seventh embodiment (FIG. 17) described previously, it is possible, through reduction of the number of components, to reduce cost and to simplify the design of the electric appliance 1.

<Boardless Mounting>

Figure 19:
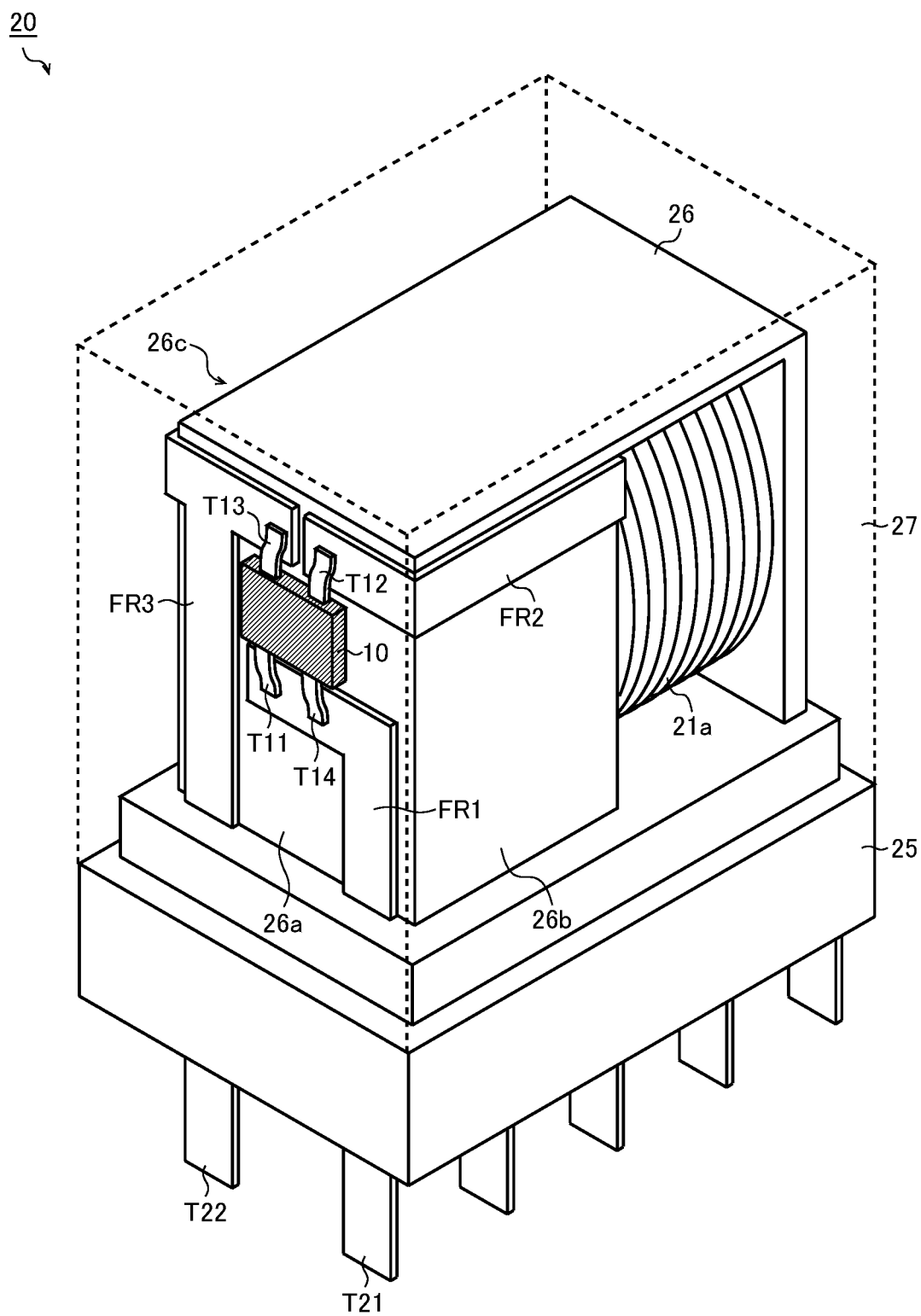
FIG. 19 is a diagram showing an example of mounting of a pulse control device.

FIG. 19 is a diagram showing an example of the mounting of the pulse control device 10 in a case where it is incorporated in a mechanical relay 20 (an example of boardless mounting in which the pulse control device 10 is mounted directly on a frame laid inside a mechanical relay 20).

The mechanical relay 20 of this configuration example, like common mechanical relays, includes a base 25 from the bottom face of which a plurality of sockets (including external terminals T21 and T22) extend, a bobbin case 26 which is fixed on the top face of the base 25, and a top cover 27 (in FIG. 20, indicated by broken lines) which covers the bobbin case 26 by enclosing it from around.

The bobbin case 26 not only provides a spool around which the relay coil 21a is wound but also holds, inside it, the contact mechanism section 22 and the like (unillustrated). On the side faces 26a to 26c of the bobbin case 26, there are laid frames FR1 to FR3 that are electrically connected to the different sockets and to the relay coil 21a.

Moreover, in the mechanical relay 20 of this configuration example, the pulse control device 10 is mounted directly on the frames FR1 to FR3. One example of practical mounting of the pulse control device 10 will now be described specifically.

The frame FR1 is laid on the side face 26a of the bobbin case 26. The frame FR1 penetrates the base 25, and is connected to the external terminal T21 (corresponding to the application terminal of the direct-current input voltage Vi).

The frame FR2 is laid over the side faces 26a and 26b of the bobbin case 26, and is connected to the first terminal of the relay coil 21a. Thus, in the mechanical relay 20 of this configuration example, to allow the pulse control device 10 to be incorporated, the conductor path from the external terminal T21 to the first terminal of the relay coil 21a is divided between the frames FR1 and FR2.

The frame FR3 is laid over the side faces 26a and 26c of the bobbin case 26. The frame FR3 penetrates the base 25 to be connected to the external terminal T22 (corresponding to the ground terminal), and is connected also to the second terminal of the relay coil 21a.

The pulse control device 10 is mounted on, of the side faces 26a to 26c of the bobbin case 26, that side face 26a on which all of the frames FR1 to FR3 are laid, at a position where there is a gap among the frames FR1 to FR3. The frames FR1 to FR3 are laid to extend up to appropriate positions that can be reached by the four external terminals T11 to T14 extending from the pulse control device 10.

The external terminal T11 (corresponding to the power terminal) and the external terminal T14 (corresponding to the enable terminal) of the pulse control device 10 are both connected to the frame FR1. That is, the external terminals T11 and T14 of the pulse control device 10 are short-circuited to each other inside the mechanical relay 20. With this connection, so long as the direct-current input voltage Vi is fed to the external terminal T21 (hence, to the frame FR1), the external terminal T14 is held at high level (corresponding to EN=H); thus, the relay coil 21a remains energized all the time.

The external terminal T12 (corresponding to the switching output terminal) of the pulse control device 10 is connected to the frame FR2. Accordingly, the first terminal of the relay coil 21a is fed with the pulse output voltage Vo from the external terminal T1 of the pulse control device 10.

The external terminal T13 (corresponding to the ground terminal) of the pulse control device 10 is connected to the frame FR3.

As described above, in the mechanical relay 20 of this configuration example, its structure is utilized to mount the pulse control device 10 directly on the frames FR1 to FR3. This eliminates the need for a separate mounting board for the incorporation of the pulse control device 10, and thus helps reduce the cost of a mechanical relay incorporating an IC.

Owing to the mounting of an IC chip without the use of a mounting board, introducing the pulse control device 10 does not require a modification in the pin arrangement, or an increase in the number of pins, of the mechanical relay. This makes it easy to shift from a mechanical relay that does not incorporate an IC to one that incorporates an IC.

As described above, the pulse control device 10 has to have at least four external terminals, namely a power terminal, a switching output terminal, a ground terminal, and an enable terminal. Accordingly, FIG. 19 shows, as an example, a pulse control device 10 in a four-pin package.

The number of pins, however, is not limited to four; a multi-pin package with more pins may be used. For easy mounting and good visibility after mounting, however, it is preferable to use a package with pins protruding out of the package resin rather than a QFN (quad flatpack no-lead) or BGA (ball grid array).

Figure 20:
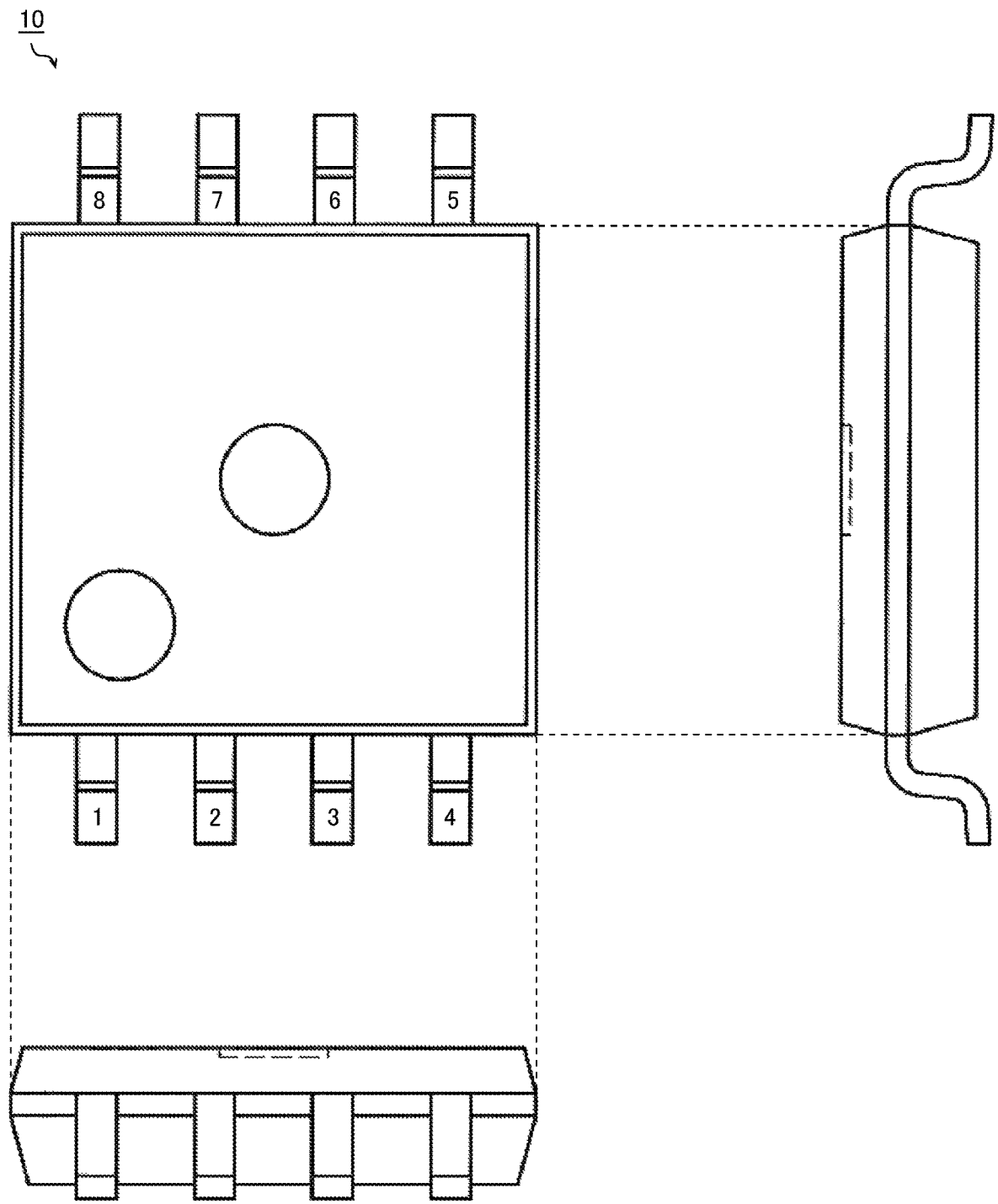
FIG. 20 is a diagram showing an example of a package of a pulse control device.

FIG. 20 is a diagram showing an example of the package of the pulse control device 10, showing here an eight-pin MSOP (mini(micro) small outline package) from which a total of eight external terminals extend, with four pins extending from each of opposite-facing sides.

Figure 21:
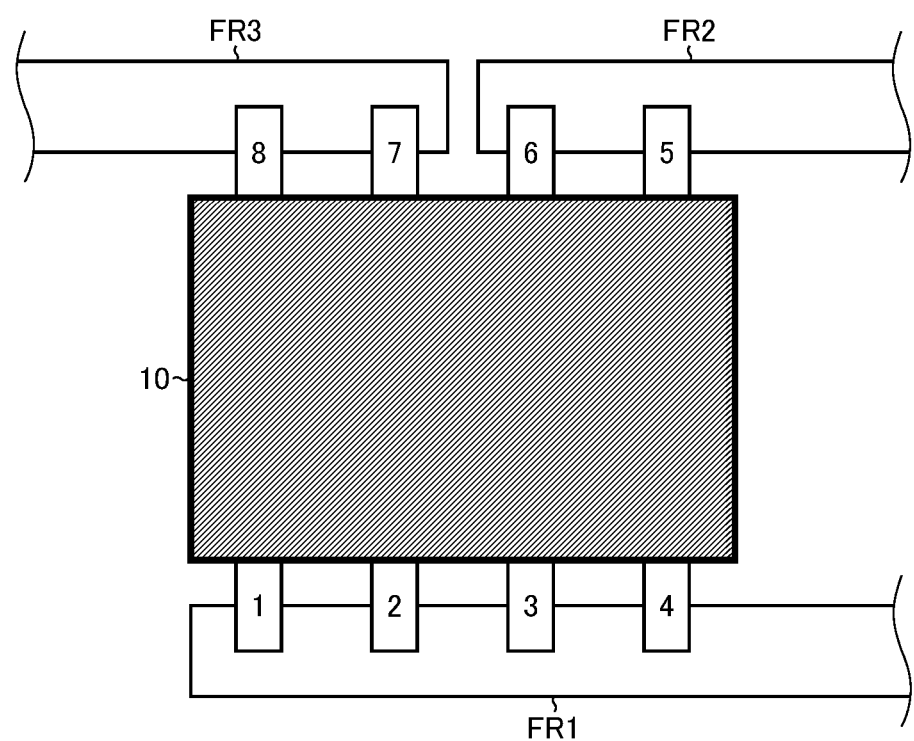
FIG. 21 is a diagram showing another example of mounting of a pulse control device.

FIG. 21 is a diagram showing an example of the mounting of the pulse control device 10 when it, in an eight-pin package (see, for example, FIG. 20), is incorporated in a mechanical relay 20.

In FIG. 21, pins 1 to 4 of the pulse control device 10 are all connected to the frame FR1. Accordingly, pins 1 to 4 include those pins which function as the previously mentioned external terminals T11 (power terminal) and T14 (enable terminal). For example, pin 1 can be assigned to the external terminal T11, pin 4 to the external terminal T14, and pins 2 and 3 can be left as non-connect terminals. Needless to say, many modifications are possible, like short-circuiting pins 1 and 2 to each other inside and assigning them to the external terminal T11, short-circuiting pins 3 and 4 to each other inside and assigning them to the external terminal T14, and so forth.

Pins 5 and 6 of the pulse control device 10 are both connected to the frame FR2. Accordingly, at least one of pins 5 and 6 functions as the previously mentioned external terminal T12 (switching output terminal).

Pins 7 and 8 are both connected to the frame FR3. Accordingly, at least one of pins 7 and 8 functions as the previously mentioned external terminal T13 (ground terminal).

<Differences From a DC-DC Converter>

Lastly, with respect to the pulse control device 10 that has been described by way of various embodiments above, its difference from the DC-DC converter X30 (in particular, the controller IC X31 in it) of the comparative example will be described.

First, the inductance value of the relay coil 21a that is connected to the pulse control device 10 is 10 mH or more (several tens of millihenries to several hundred millihenries) at the minimum. On the other hand, the inductance value of the coil X32 that is connected to the controller IC X31 in the DC-DC converter X30 is 100 µH or less (several microhenries to several tens of microhenries) at the maximum. Thus, the pulse control device 10 and the controller IC X31 differ from each other greatly in the inductance value of the coil that is connected to them.

Next, the switching frequency of the pulse output voltage Vo that is output from the pulse control device 10 is 20 kHz to 300 kHz (preferably 70 kHz to 140 kHz). The lower limit value, 20 kHz, is set with consideration given to the human audible frequency range. The upper limit value, 300 kHz, is set with consideration given to the effects of switching noise. On the other hand, in a case where the DC-DC converter X30 is incorporated in the mechanical relay X20, the switching frequency in the controller IC X31 has inevitably to be raised (for example, 2 MHz or more). Thus, the pulse control device 10 and the controller IC X31 differ from each other greatly also in the switching frequency.

<Overview>

To follow is an overview of the various embodiments described herein.

According to one aspect of what is disclosed herein, a pulse control device includes: a switching output stage configured to generate a pulse output voltage from a direct-current input voltage and feed the pulse output voltage to a load; a low-pass filter configured to receive a feedback input of the pulse output voltage and generate a feedback voltage; and an output feedback controller configured to receive the feedback voltage and control the switching output stage (a first configuration). Preferably, the output feedback controller is configured to receive the feedback voltage and control the switching output stage such that the average value of the pulse output voltage remains constant.

In the pulse control device of the first configuration described above, preferably, the low-pass filter does not include a coil (a second configuration).

In the pulse control device of the second configuration described above, preferably, the low-pass filter includes: a first resistor connected between a feedback input terminal of the pulse output voltage and an output terminal of the feedback voltage; and a second resistor and a capacitor connected in parallel with each other between the output terminal of the feedback voltage and a grounded terminal (a third configuration).

In the pulse control device of any one of the first to third configurations described above, preferably, the switching frequency of the pulse output voltage is higher than the human audible frequency range (a fourth configuration).

In the pulse control device of any one of the first to fourth configurations described above, preferably, the pulse control device is integrated into a semiconductor device (a fifth configuration).

In the pulse control device of any one of the first to fifth configurations described above, preferably, as the load, a relay coil is connected to the pulse control device so that the pulse control device functions as a device that drives a mechanical relay (a sixth configuration).

In the pulse control device of the sixth configuration described above, preferably, the output feedback controller is configured such that whether the generation of the pulse output voltage is enabled or disabled is controlled in accordance with an on/off control signal for the mechanical relay (a seventh configuration).

In the pulse control device of the seventh configuration described above, preferably, the output feedback controller is configured to set a target average value of the pulse output voltage at a first level after the pulse output voltage starts to be generated until the excitation current passing through the relay coil exceeds at least the operating current value and thereafter drop the target average value of the pulse output voltage down to a second level lower than the first level within a range where the excitation current does not drop below the recovery current (an eighth configuration).

According to another aspect of what is disclosed herein, an electric appliance includes: a mechanical relay; and the pulse control device of any one of the sixth to eighth configurations described above, the pulse control device feeding the pulse output voltage to the relay coil of the mechanical relay (a ninth configuration).

In the electric appliance of the ninth configuration described above, preferably, there may be further provided a filter configured to eliminate spike noise in the pulse output voltage (a tenth configuration).

In the electric appliance of the tenth configuration described above, preferably, the LC values in the filter are freely selectable within such a range as not to affect system stability.

According to another aspect of what is disclosed herein, a pulse control device includes: a switching output stage configured to feed a pulse output voltage to the relay coil of a mechanical relay; and a light-emitting element driver configured to feed an output current to a light-emitting element in the mechanical relay (a twelfth configuration).

In the pulse control device of the twelfth configuration described above, preferably, the light-emitting element driver is configured to include an open-drain output stage that turns on and off the output current in accordance with an input signal (a thirteenth configuration).

In the pulse control device of the twelfth or thirteenth configuration described above, preferably, the light-emitting element driver is configured to be switchable between being valid and being invalid (a fourteenth configuration).

According to another aspect of what is disclosed herein, an electric appliance includes: a mechanical relay including a relay coil and a light-emitting element; and the pulse control device of any one of the twelfth to fourteenth configurations described above (a fifteenth configuration).

According to another aspect of what is disclosed herein, a mechanical relay includes: a relay coil; a light-emitting element; and the pulse control device of the twelfth or thirteenth configuration described above (a sixteenth configuration).

According to another aspect of what is disclosed herein, a pulse control device includes a switching output stage configured to feed a pulse output voltage to a relay coil. The switching output stage includes a synchronous rectification transistor, or a rectification diode, that is connected in parallel with the relay coil, and the body diode that accompanies the synchronous rectification transistor, or the rectification diode, is used as a regeneration diode (a seventeenth configuration).

According to another aspect of what is disclosed herein, a mechanical relay includes: a relay coil; a first frame to which a direct-current input voltage is applied; a second frame to which the first terminal of the relay coil is connected; a third frame to which the second terminal of the relay coil is connected; and a pulse control device mounted directly on the first, second, and third frames and configured to feed a pulse output voltage to the relay coil (an eighteenth configuration).

In the mechanical relay of the eighteenth configuration described above, preferably, the pulse control device is a semiconductor integrated circuit device that includes: a power terminal connected to the first frame; a switching output terminal connected to the second frame; a ground terminal connected to the third frame; and an enable terminal connected to the first frame (a nineteenth configuration).

In the mechanical relay of any one of the sixteenth, eighteenth, and nineteenth configurations, preferably, the inductance value of the relay coil is 10 mH or more (a twentieth configuration).

In the pulse control device of any one of the twelfth to fourteenth and seventeenth configurations, preferably, the switching frequency of the pulse output voltage is 20 kHz to 300 kHz (a twenty-first configuration).

Any appropriate combination of two, three, or more of the first to twenty-first configurations falls within the scope of the present invention. Moreover, any combined configuration may be part of any of the first to twenty-first configurations. For example, a pulse control device may include: a switching output stage configured to generate from a direct-current input voltage a pulse output voltage with a switching frequency of 20 kHz or more but 300 kHz or less and feed the pulse output voltage to a load; and an output feedback controller configured to control the switching output stage based on a feedback voltage generated by receiving a feedback input of the pulse output voltage (a twenty-second configuration). The feedback voltage may be generated by a low-pass filter by receiving the feedback input of the pulse output voltage. As the load, a mechanical relay with an inductance value of 10 mH or more may be connected to such a pulse control device so that the pulse control device functions as a device that drives the mechanical relay.

<Other Modifications>

The various technical features disclosed herein can be implemented in any manner other than specifically described by way of embodiments above, and allow for many modifications within the spirit of the technical ingenuity involved. For example, bipolar transistors and MOS field-effect transistors are mutually interchangeable, and the logic levels of the various signals can be inverted as desired. That is, it should be understood that the embodiments disclosed herein are in every aspect illustrative and not restrictive, and that the technical scope of the present invention is defined not by the description of embodiments given above but by the scope of the appended claims and encompasses any modifications in the sense and scope equivalent to those of the claims.

INDUSTRIAL APPLICABILITY

Pulse control devices according to what is disclosed herein can be used suitably as a means for driving mechanical relays.

LIST OF REFERENCE SIGNS 1 electric appliance
10 pulse control device
20 mechanical relay
21 electromagnetic section
21a, 21a1, 21a2 relay coil
21b iron core
21c armature
21d card
22 contact mechanism section
22a, 22b fixed contact
22c moving spring
22d moving contact
23 resistor
24 light-emitting diode (light-emitting element)
25 base
26 bobbin case
26a, 26b, 26c side face
27 top cover
30 regeneration diode
40 filter
41 coil
42 capacitor
100 switching output stage
110 high-side switch (output transistor: PMOSFET)
120 low-side switch (synchronous rectification transistor: NMOSFET)
120B body diode
130 rectification diode
200 output feedback controller
220 comparator
230 on-time setter
231 resistor
232 capacitor
233 switch 234 comparator
240 gate controller
241 D flip-flop
242 level shifter
243, 244 driver
250 timer
260 error amplifier
270 oscillator
280 comparator
300 low-pass filter
301, 302 resistor
303 capacitor
400 LED driver (light-emitting element driver)
401 NMOSFET
402 resistor
T11 to T15, T21 to T26 external terminal
FR1 to FR3 frame

The invention claimed is:

1. A pulse control device comprising:
   a switching output stage configured to generate a pulse output voltage from a direct-current input voltage and feed the pulse output voltage to a load;
   a low-pass filter configured to receive a feedback input of the pulse output voltage and generate a feedback voltage; and
   an output feedback controller configured to receive the feedback voltage and control the switching output stage such that an average value of the pulse output voltage remains constant,
   wherein as the load, a relay coil is connected to the pulse control device so that the pulse control device functions as a device that drives a mechanical relay, and
   wherein the output feedback controller is configured such that whether generation of the pulse output voltage is enabled or disabled is controlled in accordance with an on/off control signal for the mechanical relay.

2. The pulse control device according to claim 1, wherein the low-pass filter does not include a coil.

3. The pulse control device according to claim 2, wherein the low-pass filter includes:
   a first resistor connected between a feedback input terminal of the pulse output voltage and an output terminal of the feedback voltage; and
   a second resistor and a capacitor connected in parallel with each other between the output terminal of the feedback voltage and a grounded terminal.

4. The pulse control device according to claim 1, wherein a switching frequency of the pulse output voltage is higher than a human audible frequency range.

5. The pulse control device according to claim 1, wherein the pulse control device is integrated into a semiconductor device.

6. The pulse control device according to claim 1, wherein the output feedback controller is configured to
   set a target average value of the pulse output voltage at a first level after the pulse output voltage starts to be generated until an excitation current passing through a relay coil exceeds at least an operating current value and
   thereafter drop the target average value of the pulse output voltage down to a second level lower than the first level within a range where the excitation current does not drop below a recovery current.

7. An electric appliance comprising:
   a mechanical relay; and
   the pulse control device according to claim 1, the pulse control device feeding the pulse output voltage to a relay coil of the mechanical relay.

8. The electric appliance according to claim 7, further comprising a filter configured to eliminate spike noise in the pulse output voltage.

9. The electric appliance according to claim 8, wherein LC values in the filter are freely selectable within such a range as not to affect system stability.

* * * * *